US012658694B2

(12) United States Patent
Doynov

(10) Patent No.: US 12,658,694 B2
(45) Date of Patent: Jun. 16, 2026

(54) METHOD AND RECONFIGURABLE INLINE SYSTEMS FOR PROTECTION FROM TRANSIENT ELECTROMAGNETIC ENERGY DISTURBANCE

(71) Applicant: EMP Shield, Inc., Burlington, KS (US)

(72) Inventor: Plamen Doynov, Kansas City, MO (US)

(73) Assignee: EMP Shield, Inc., Burlington, KS (US)

( * ) Notice: Subject to any disclaimer, the term of this patent is extended or adjusted under 35 U.S.C. 154(b) by 89 days.

(21) Appl. No.: 18/201,182

(22) Filed: Sep. 14, 2023

(65) Prior Publication Data

US 2024/0079868 A1      Mar. 7, 2024

Related U.S. Application Data

(63) Continuation-in-part of application No. 17/888,107, filed on Aug. 15, 2022, now Pat. No. 11,689,015, and
(Continued)

(51) Int. Cl.
H02H 9/04        (2006.01)
G01R 31/12        (2020.01)
(Continued)

(52) U.S. Cl.
CPC ............. *H02H 9/045* (2013.01); *G01R 31/12* (2013.01); *G01R 31/327* (2013.01); *H02H 5/00* (2013.01); *H02H 5/005* (2013.01); *H02H 9/04* (2013.01); *H02H 3/08* (2013.01); *H02H 3/105* (2013.01); *H02H 3/22* (2013.01); *H02H 9/041* (2013.01); *H02H 9/046* (2013.01)

(58) Field of Classification Search
CPC ............ H02H 9/045; H02H 5/00; H02H 9/04; H02H 3/08; H02H 9/046; H02H 3/22; H02H 3/105; H02H 9/041; H02H 5/005; H02H 3/20; H01C 7/12; H01C 8/04
USPC .................................................. 361/117–119
See application file for complete search history.

(56) References Cited

U.S. PATENT DOCUMENTS

2015/0109710 A1*   4/2015   Politis .................. H02G 15/113
                                                            361/119
2018/0159319 A1*   6/2018   Miller ...................... H01Q 1/50
2019/0214814 A1*   7/2019   Carty .................... G01R 31/12

* cited by examiner

*Primary Examiner* — Danny Nguyen
(74) *Attorney, Agent, or Firm* — AVEK IP, LLC; Joseph L. Johnson

(57) ABSTRACT

A method and system for suppressing EMP-induced voltage surges due to transient electromagnetic energy disturbance such as a detonation of a nuclear weapon at high altitude generating an EMP (HEMP) comprising E1, E2, and E3 component pulses. Surge protection assemblies are mounted inline, intermediate AC and DC distribution power lines and a plurality of electrical and electronic devices, powered by the lines. The inline mounting of the reconfigurable surge suppression system eliminates any time delay response of the plurality of protecting assemblies and the allowable voltage amplitude level of the protecting assemblies are selected and combined to achieve a predefined desired response time and protection level capacity to react to and mitigate the E1, E2, and E3 components of a complex multi-pulse EMP pulse generated by detonation of a nuclear weapon at high altitude (HEMP). The reconfigurable surge suppressing systems is interoperable with plurality of electrical interfaces.

17 Claims, 17 Drawing Sheets

Related U.S. Application Data a continuation-in-part of application No. 17/521,369, filed on Nov. 8, 2021, now Pat. No. 11,451,051, which is a continuation-in-part of application No. 17/148,168, filed on Jan. 13, 2021, now Pat. No. 11,171,483, which is a continuation-in-part of application No. 16/925,600, filed on Jul. 10, 2020, now Pat. No. 10,938,204, which is a continuation-in-part of application No. 16/597,427, filed on Oct. 9, 2019, now Pat. No. 10,742,025, which is a continuation-in-part of application No. 16/240,897, filed on Jan. 7, 2019, now Pat. No. 10,530,151.

(60) Provisional application No. 62/615,159, filed on Jan. 9, 2018.

(51) Int. Cl.

| | |
|---|---|
| *G01R 31/327* | (2006.01) |
| *H02H 5/00* | (2006.01) |
| *H02H 3/08* | (2006.01) |
| *H02H 3/10* | (2006.01) |
| *H02H 3/22* | (2006.01) |

Early time HEMP (E1)

$E_1(t) = 0 \quad$ for $t \le 0$ $E_1(t) = E_{01} \; k_1 \left[e^{a_1 t} - e^{b_1 t}\right] \quad$ for $t > 0$ where $\quad E_{01} = 50,000$ V/m, $\qquad a_1 = 4 \times 10^7$ s$^{-1}$, $\qquad b_1 = 6 \times 10^8$ s$^{-1}$, and $\qquad k_1 = 1.3$

Intermediate time HEMP (E2)

$E_2(t) = 0 \quad$ for $t \le 0$ $E_2(t) = E_{02} \; k_1 \left[e^{a_2 t} - e^{b_2 t}\right] \quad$ for $t > 0$ where $\quad E_{02} = 100$ V/m, $\qquad a_2 = 1 \times 10^3$ s$^{-1}$, $\qquad b_2 = 6 \times 10^8$ s$^{-1}$, and $\qquad k_2 = 1.0$

Late time HEMP (E3)

$E3(t) = E_i(t) + E_j(t)$ $E_i(t) = 0 \quad$ for $\tau \le 0$ $E_i(t) = E_{0i} \; k_1 \left[e^{a_i \tau} - e^{b_i \tau}\right] \quad$ for $\tau > 0$ where $\quad \tau = t - 1, \quad E_{0i} = 0.04$ V/m, $\qquad a_i = 0.02$ s$^{-1}$, $b_i = 2$ s$^{-1}$, and $\qquad k_i = 1.058$ $E_j(t) = 0 \quad$ for $\tau \le 0$ $E_j(t) = E_{0j} \; k_1 \left[e^{a_j \tau} - e^{b_j \tau}\right] \quad$ for $\tau > 0$ where $\quad \tau = t - 1, \quad E_{0j} = 0.01326$ V/m, $\qquad a_j = 0.015$ s$^{-1}$, $b_j = 0.02$ s$^{-1}$, and $\qquad k_j = 9.481$

FIG. 6

| Standard Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field E$_o$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| α (1/sec) | 4x10$^6$ | 4x10$^7$ | 2.20x10$^8$ | 3.22x10$^7$ | 4x10$^7$ |
| β(1/sec) | 4.76x10$^8$ | 6x10$^8$ | 3.24x10$^7$ | 2.07x10$^9$ | 6x10$^8$ |
| Energy Density | 0.891 J/m$^2$ | 0.114 J/m$^2$ | 0.167 J/m$^2$ | 0.196 J/m$^2$ | 0.114 J/m$^2$ |

FIG. 7

| IEC E1 HEMP Waveform Properties | |
|---|---|
| Characteristic | Value |
| Waveform peak | $E_{peak} = 50,000\,\text{V}/\text{m}$ |
| Spectrum peak | $E_{low\,freq} = 0.00152\,\text{V}/\text{m}/\text{Hz}$ |
| Waveform peak power | $P_{peak} = 6.64 \times 10^{6}\,\text{W}/\text{m}^2$ |
| Spectrum peak power | $P_{low\,freq} = 6.11 \times 10^{-9}\,\text{W}/\text{m}^2/\text{Hz}$ |
| Total energy | $W_{total} = 0.115\,\text{J}/\text{m}^2$ |
| Time of peak | $t_{peak} = 4.84\,\text{ns}$ |
| Rise time, 10% to 90% of peak | $t_{10-90} = 2.47\,\text{ns}$ |
| Pulse width, full width at half maximum | $\text{FWHM} = 23.0\,\text{ns}$ |
| Pulse width, total energy over peak power | $W_{total}/P_{peak} = 17.3\,\text{ns}$ |
| Spectrum width, total energy over peak spectrum power | $W_{total}/P_{low\,freq} = 18.8\,\text{MHz}$ |

FIG. 8

Table 1. Standard NEMA receptacles and plugs.

| Voltage | | 15A | | 20A | | 30A | | 50A | | 60A | |
|---|---|---|---|---|---|---|---|---|---|---|---|
| 125 V | 1 | 1-15R | 1-15P | | | | | | | | |
| 250V | 2 | | 2-15P | 2-20R | 2-20P | 2-30R | 2-30P | | | | |
| 125V | 5 | 5-15R | 5-15P | 5-20R | 5-20P | 5-30R | 5-30P | 5-50R | 5-50P | | |
| 250V | 6 | 6-15R | 6-15P | 6-20R | 6-20P | 6-30R | 6-30P | 6-50R | 6-50P | | |
| 277V, A.C. | 7 | 7-15R | 7-15P | 7-20R | 7-20P | 7-30R | 7-30P | 7-50R | 7-50P | | |
| 125/ 250V | 10 | | | 10-20R | 10-20P | 10-30R | 10-30P | 10-50R | 10-50P | | |
| 3∅ 250V | 11 | 11-15R | 11-15P | 11-20R | 11-20P | 11-30R | 11-30P | 11-50R | 11-50P | | |
| 125/ 250V | 14 | 14-15R | 14-15P | 14-20R | 14-20P | 14-30R | 14-30P | 14-50R | 14-50P | 14-60R | 14-60P |

FIG. 22

Table 2. Connector and inlets for EV Charging.

| | N. America | Japan | Europe | China | All markets |
|---|---|---|---|---|---|
| AC | J1772 (Type1) | J1772 (Type1) | Mennekes (Type2) | GB/T | |
| DC | CCS1 | CHAdeMO | CCS2 | GB/T | Tesla |

Table 3. Inlet level categories and typical power output.

| | Level 1 | Level 2 | DC Fast Charging |
|---|---|---|---|
| Connector type | | | |
| Typical power output | 1 kW | 7 kW – 19 kW | 50 kW – 350 kW |

Table 4. Inlets voltage and current rating, communication protocols and standards.

| Standard | CHAdeMO | GB/T | CCS Type 1 | CCS Type 2 | Tesla | ChaoJi |
|---|---|---|---|---|---|---|
| Compliant Standard | IEEE 2030.1.1 IEC 62916-3 | IEC 62916-3 | SAE J1772 IEC 62916-3 | IEC 62916-3 | NA | CHAdeMO and GB/T |
| Connector inlet | | | | | | |
| Max Voltage [V] | 1000 | 750 | 600 | 900 | 500* | 1500 |
| Max Current [A] | 400 | 250 | 400 | 400 | 630* | 600 |
| Max Power [kW] | 400 | 185 | 200 | 350 | 250* | 900 |
| Com Protocol | CAN | | PLC | CAN | CAN | CAN |
| Start year | 2009 | 2013 | 2014 | 2013 | 2012 | 2020 |

Note: * indicates specifications for Tesla Supercharger V3.

FIG. 23

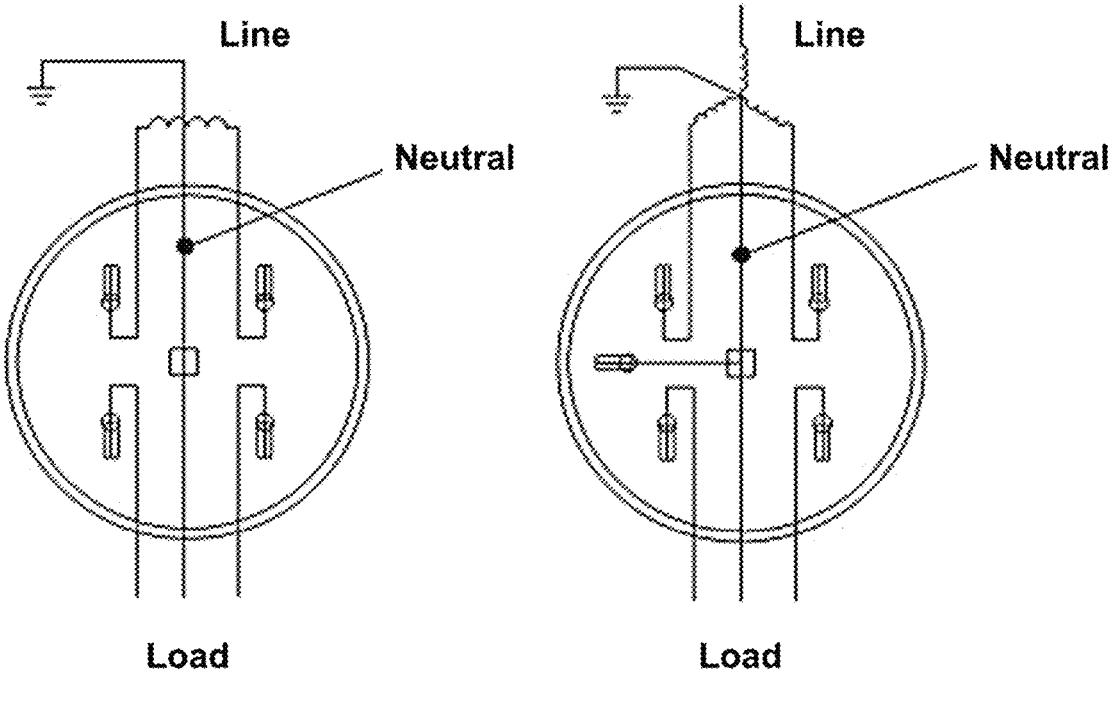
120/240V 3-wire            120/208V 3-wire network
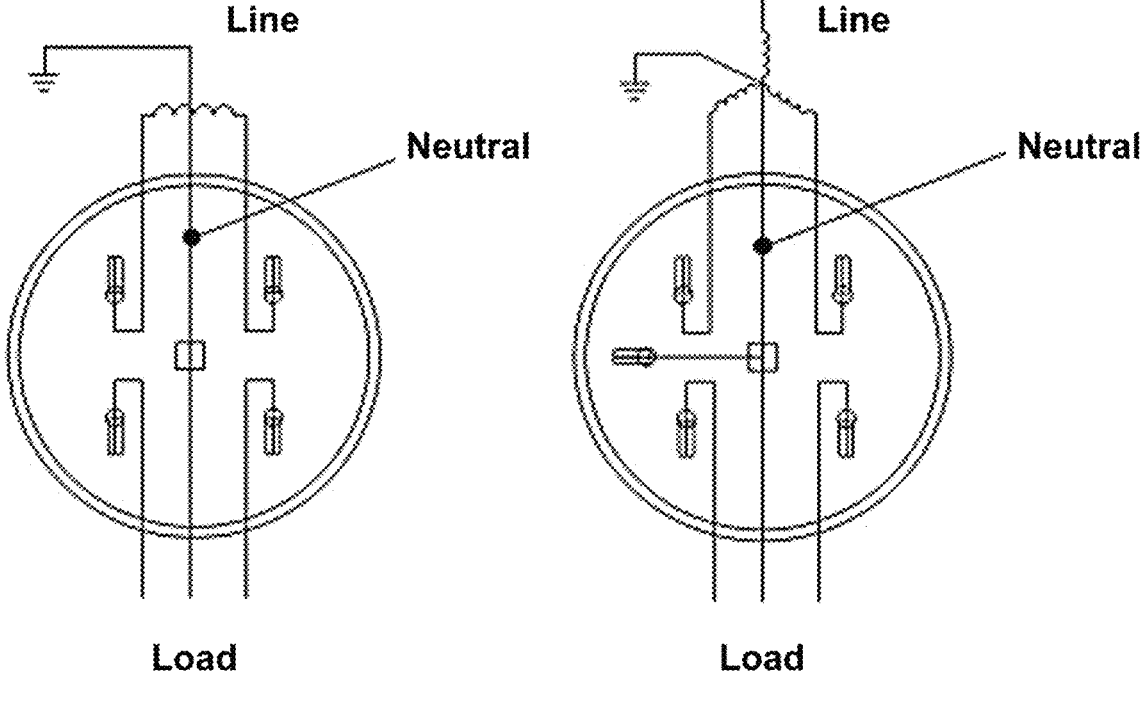
120/240V 3-wire            120/208V 3-wire network
FIG. 24

METHOD AND RECONFIGURABLE INLINE SYSTEMS FOR PROTECTION FROM TRANSIENT ELECTROMAGNETIC ENERGY DISTURBANCE

REFERENCE TO RELATED APPLICATIONS

This application claims the priority of non-provisional patent application Ser. No. 17/888,107 filed on Aug. 15, 2022, titled Method and Systems for Protection of Multiport Multimode Power Over Ethernet Devices from Electromagnetic Energy Disturbance, which claims the priority art of non-provisional patent application Ser. No. 17/521,369 filed on Nov. 8, 2021, (now U.S. Pat. No. 11,451,051), titled Method and Systems for Protection of Electrical Multiports from Electromagnetic Pulse Using Impedance Matching and Low Insertion Loss Design, which claims the priority art of non-provisional patent application Ser. No. 17/148,168 filed on Jan. 13, 2021, titled Method and Systems for Detection and Protection from Electromagnetic Pulse Events Using Hardware Implemented Artificial Intelligence (now U.S. Pat. No. 11,171,483), which claims the priority art of non-provisional patent application Ser. No. 16/925,600 filed Jul. 10, 2020 (now U.S. Pat. No. 10,938,204), titled Method for Detecting an Isolating an Electromagnetic Pulse for Protection of a Monitored Infrastructure, which claims the priority of non-provisional patent application Ser. No. 16/597,427 filed Oct. 9, 2019, (now U.S. Pat. No. 10,742,025), titled System and Method for Detecting an Isolating an Electromagnetic Pulse for Protection of a Monitored Infrastructure, which claims the priority of non-provisional patent application Ser. No. 16/240,897 filed Jan. 7, 2019 (now U.S. Pat. No. 10,530,151), titled System and Method For Suppressing Electromagnetic Pulse-Induced Electrical System Surges, which claims the benefit of provisional patent application U.S. Ser. No. 62/615,159 filed Jan. 9, 2018 titled System and Method For Suppressing Electromagnetic Pulse-Induced Electrical System Surges, all of which are incorporated in their entirety herein by reference.

FIELD OF THE INVENTION

This invention relates to mitigating the impending effects of excessive electromagnetic energy on electrical power distribution lines and preventing damage to the connected electrical and electronic infrastructure and systems.

BACKGROUND OF THE INVENTION

The background content provides information that is useful and may be used in understanding the present invention. It is not an admission that any of the information provided herein is prior art or that the referenced background information is prior art.

Electromagnetic energy surges are phenomena where over-voltages and current spikes exceeding the normal operational range occur for a short period of time. The sources of powerful surges are electrical grid circuit switching, natural lightning strikes, electromagnetic interference (EMI) coupling, electrostatic discharge (ESD), nuclear electromagnetic pulses (NEMP), non-nuclear EMP (NNEMP) based on high-power electromagnetic (HPEM) sources, narrow, wide, and ultra-wide band directed energy weapons (DEW) sources, and geo-magnetic disturbance (GMD), as summarized in FIG. 1. The sources based on natural phenomena or technology-based sources for intentional EMI (IEMI) can impose devastating effects on electrical and electronic infrastructure. To prevent or minimize the damage due to electromagnetic disturbance, proper design and installation of protection and grounding system is essential to suppress the surge, absorb the energy, and/or redirect the energy to ground.

The term electromagnetic pulse (EMP) is used to describe a transient burst of electromagnetic (EM) energy and the associated electromagnetic disturbances due to energy coupling to conductive surfaces and lines. In this document, the term "EMP" is used to describe the electromagnetic fields generated by natural or manmade sources. Frequently, the term High-altitude Nuclear EMP (HNEMP) is also used. The terms "EMP" or "HEMP" as used herein refer to the electromagnetic pulse generated by a nuclear bomb detonation, a directed energy system for high-power EM generation, other devices for IEMI or natural EMP events as a result from a Coronal Mass Ejection (CME), supernova explosion, and other cosmic phenomenon resulting in Geomagnetic Disturbance (GMD) and large scale EMP effects.

In time domain, the EMP is presented with a waveform that describes how the amplitude of the pulse changes in time. Several specific parameters correlate the waveform to the intensity of the EMP. The real EM pulses tend to vary and to be quite complex, so their simplified descriptions are typically characterized by:

The type of EM energy coupling—radiated EM (direction of propagation, polarization, etc.), conducted, electric, magnetic, etc.

Pulse waveform: shape (rise and fall time), pulse width at half maximum (PWHM), duration, and peak amplitude.

The range or spectrum of frequencies present and the power spectrum distribution (in frequency domain).

Any EMP is associated with electromagnetic interference (EMI) which is related to the frequency content and spectral distribution and is classified as "narrowband", "wideband" and "ultrawideband" distributed in different frequency ranges. The frequency spectrum and the pulse waveform in time domain are interrelated analytically via the Fourier transform and other mathematical transformations for joint time-frequency representation (wavelets, spectrograms, etc.). An EMP typically contains energy at many frequencies from direct current (DC) to some upper limit depending on the source. Withing the bandwidth, there could be multiple spectral peaks with high magnitudes. In general, the shorter the pulse (which also implies a short rise time) the broader the spread over a range of frequencies. The commonly used first-order approximation is $f_h = 0.35/\tau_r$, where $f_h$ is the high frequency range (Hz) and $\tau_r$ is the rise time of the pulse (sec) from 10% to 90% of its peak amplitude.

FIG. 2 is a pictograph of an electromagnetic pulse generated by a high-altitude nuclear explosion in the atmosphere. Before the figures which are directly pertinent to this invention, ten figures are included to supplement the description of the physical phenomena that result in the extreme intensity of a high altitude EMPs, as shown in the modeling and coupling simulations of the generated electromagnetic field. Furthermore, a part of a NEMP resembles the characteristics of frequently occurring natural lightning strikes, and others are reminiscent to GMD events.

In general, the interactions of the high-energy gamma rays with atoms in the atmosphere produce electrons which interact with the Geo-magnetic field producing EM field with a Poynting vector from the burst source towards the Earth's surface. The field generated by a high-altitude EMP (HEMP) has direction variation along a north-south central line and over the horizon extended effects, as illustrated in FIG. 3, which is a pictograph of HEMP and the Electromagnetic Field (EMF) Poynting vector direction with respect to the observer's location. The intensity of the pulse varies by location (latitude) due to the Geo-magnetic field distribution. Some additional relevant factors will be discussed further while the detailed specifics of the related physical phenomena are beyond the scope of this application.

An EMP event can induce voltages and corresponding currents into multiple and different electrical systems. The voltage/current magnitudes depend on the coupling of the EM field with the system (its susceptibility) and the characteristics of the EM wave (direction, polarization, frequency content, and others). The long and exposed transmission lines of wide-area power distribution grids, as well as the electrical systems of localized mini-grids, renewable energy systems, communication lines, homes' wiring, commercial buildings, and even vehicle electrical systems. FIG. 4 illustrates the coupling of the EM energy into a transmission line at height h above the ground (Earth's surface). The image displays a few key relations of the Electric field (E) and Magnetic field (B) using the Half-space Earth model. The image is from "The Early-time (E1) HEMP and its impact on the US Power Grid" report, written in 2010 by Savage et al., Metatech Corp., and provides an excellent analysis of the physical phenomena associated with the HEMP.

Without proper protection measures, over-voltage surges can disturb, damage, or destroy components within the electrical systems in the area of impact, diminishing the operability of the electrical system or rendering it unusable until repaired. Persistent and successful protection is possible only with implementation of adequate surge shielding (e.g., Faraday cage) and/or methods for surge limiting and energy redirection and absorbing. For example, multiple methods and tools are developed and used for surge protection from EM energy associated with lightning. While the duration of a lightning strike appears very short (microseconds, $10^{-6}$ s), it is orders of magnitude longer than the duration of what is known in the literature as the E1 HEMP, which is order of nanoseconds, ($10^{-9}$ s). As shown in FIG. 2, due to its origin, a HEMP will induce effects in a very large area. Similarly, it is understood that a massive solar mass ejection (CME) reaching the Earth results in GMD which has damaging effects on electrical infrastructure.

Unlike the electromagnetic radiation or pulse associated with common natural phenomena (lighting strikes, transmission lines overvoltage, and overcurrent surges, etc.), the HEMP comprises of more complex time and frequency domain characteristics. The HEMP is described with several stages in time following the nuclear blast. They are also known as HEMP phases or pulses of varying waveform (magnitude, duration, frequency content, etc.). Therefore, the HEMP is more accurately considered as a complex, electromagnetic multi-pulse event, usually described in terms of sequence of three primary components defined by the International Electrotechnical Commission (IEC) as E1, E2, and E3 phases of the high-altitude EMP (HEMP). The characteristics of these phases (pulses) of HEMP are further described in this application. The relative electric field strength of the time sequence is displayed in FIG. 5A and FIG. 5B using logarithmic scales for the electric field strength E (V/m) vs Time (s). Some of the commonly used analytical expressions for the HEMP E1, E2, and E3 waveforms are given in FIG. 6, which presents the accepted values for the analytical expressions.

Starting in the 1960s, multiple waveform models have been developed to establish standards for testing the effects and the associated hazardous effects. The series of standards related to the description of the associated waveforms and known as IEC 77C Standards. The evolution of the unclassified standards with respect to the E1 HEMP environment can be seen in the Table in FIG. 7, which displays the evolution of the waveform parameters of the unclassified HEMP E1 environment Standards. Some additional details of the associated pulse waveform characteristics are given in the Table in FIG. 8. As can be seen from the Table in FIG. 7, the most common analytical expressions for E1 HEMP are the Difference of double exponential (DEXP) and the Quotient of exponentials (QEXP). The plots of DEXP and QEXP in time domain and their respective spectral distribution in frequency domain are presented in FIG. 9A. The Double Exponential (DEXP) and the Quotient Exponential (QEXP) are most frequently used for modeling. FIG. 9B displays the waveform of the E2 HEMP and its analytical expression. FIG. 9C displays the waveforms associated with the two phases of E3 HEMP. Additional analytical expressions and models have been developed but they are beyond the scope of this application.

The damage to electrical and electronic devices is determined by the amount of energy and the rate at which the energy is transferred to devices in the electromagnetic environment. All electrical or electronic equipment devices are susceptible to some level which may result in disturbance, malfunctions, or permanent damage under electromagnetic radiation of sufficient intensity. The frequency content of the waveform plays a major role in the coupling mechanism (the susceptibility and, respectively, the immunity of a system). The plots in FIG. 10 illustrate the power spectrum density (V/m-Hz) associated with HEMP E1, an atmospheric lightning, and IEMI (high-power microwave, high-intensity RF).

The level of system vulnerability is dependent on the intensity of the EMF and the coupling of the external fields to the electrical circuits and the sensitivity characteristics of circuits components. A temporary malfunction (or upset) can occur when an electromagnetic field induces current(s) and voltage(s) in the operating system electronic circuits at levels that are within the rated upper limits of components' characteristics. Regardless the source of EMI, two principal radiation coupling modes are recognized in the literature and the relevant standards assessing how much radiated power is coupled into target systems: (1) "front door" coupling, (FDC), and (2) "back door" coupling, (BDC). The FDC is typically observed when the power radiated from the RF/HPM source is directly coupled into the communication input of electronic systems. The antenna subsystem is designed to receive and transmit RF signals, and thus providing an efficient path for the EM energy flow from the electromagnetic environment to enter the equipment and cause damage especially when the antenna's bandwidth is withing the frequency range of the EM source. As seen in FIG. 10, the HEMP E1 has a very broad bandwidth. While the low frequencies (long wavelengths) couple to long conductor (electrical transmission line, pipelines, etc.), the higher frequencies (shorter wavelength) couple via small apertures, making effective shielding more challenging.

The BDC occurs when the electromagnetic field from the source produces large transient voltage/currents or the EM waves propagate and couple through the gaps, small apertures, fixed electrical wiring and interconnecting cables, connections to the power mains, communication cables, network and telephone coper wires, unshielded sections, and others. The BDC can generally be described as a wide-range interference at specific narrow-band susceptibility characteristics because of existing apertures and modes of coupling to cables.

Since the impinging EMP field has a broad frequency spectrum and a high field strength, the antenna response must be considered both in and out of the antenna's band. The inadvertent, unintended, or parasitic antennae are electrically penetrating conducting structures, power lines, communication cables, and others that collect EMP energy and allow its entry into a building, a device, or an enclosure. The lines of the electrical grid can be considered as antenna pathways connected to the upstream and downstream components of the grid and are susceptible to broadband frequencies, including the lower frequency (long wavelength) coupling due to the long length of the power transmission lines. Additional factors influence the level of coupling and interference: wave polarization, geolocation, ground surface conductivity, height of the wires above ground, and others. With their long length, the electrical transmission lines are also susceptible to the E3 HEMP, as further described below.

The internal electrical wirings of a building are also susceptible to EMF and would couple directly to the radiated field if the building is without proper shielding. The exposed long wires or internal unshielded wires are susceptible to the radiated field. Without proper mitigation, the induced currents generate magnetic fields that couple the neighboring conductive lines and surfaces. Protection from radiated coupling of EM field is achieved by shielding equipment with a conductive enclosure. In some special cases, the whole building is a shielded structure commonly known as a Faraday cage. Because input and output cables for power and communications must be present, special methods are employed to lower and limit the propagation of the induced transients via these wired connections and their conduit openings.

As described in the referenced related prior patents, one possible way to mitigate the effects of EMP is to provide a response in real time to an event and disconnect the protected systems by isolating them physically from long cables, wires, antennas, etc. Specifically, to protect from the damaging effects of EMP, the environment must be persistently monitored with applicable sensors and when an EMP is detected, the appropriate isolation systems must be triggered to provide protection for the infrastructure. Given the high speed of the HEMP E1 event, this is not an easy task and has major constraints that have been addressed in the referenced relevant patents with methods and systems designed and implemented for specific environments.

A straightforward protection method is to equip the electrical and electronic systems with means that prevent the excessive magnitude of voltage and current from reaching the electrical load and absorb and redirect the energy of the EMP. Generally, these devices are known as surge suppressors and arrestors. Most commercially available surge suppressing devices are designed and built to offer protection to lightning with micro-seconds response times. This is not sufficient for protection from the HEMP E1 with a few nanoseconds rise time and from IEMI with variable characteristics (rise time/frequency content and repetition rate). The referenced related applications provide solutions for mitigation of the E1, E2, and E3 components of an EMP. They are oriented to electrical power systems operating at different voltage and current amplitudes and at extremely low frequencies (ea. 60 Hz of the US electrical grid, 50 Hz internationally). These systems based on the referenced prior art are usually designed and implemented to be installed by a certified electrician which is associated with an additional step towards the implementation of EMP protection on a larger scale. It is important to note that localized, small capacity surge protection devices exist and are commercially available. They are implemented in some extension cords and plug in module for 120 VAC, 15 A electrical outlets. These devices provide localized limited level of protection and cannot be utilized for high power electrical consumer and industrial appliances. For example, in a residential house this applies to an electrical dryer, electrical range, electrical vehicle charging station. Most of the commercially available transient surge protection systems are designed and implemented to be connected across the AC power lines, commonly referred to as a T-tap type connection, which does not provide in series installation with the AC power lines (like the high-power filters, for example). A generalized view of surge protection installation across the power lines is shown in FIG. 11.

Across the lines installation of surge suppression systems does not affect the normal operation of low frequency AC power lines (60 Hz or 50 Hz). However, it is not the optimal with respect to transient suppression. do not influence the normal operation of the system. While it offers the advantage of a less complex manufacturing and easier installation, across the lines installation results in transmission lines configuration topology that is not optimal when the short HEMP E1 and E2 pulses with high frequency spectrum are considered. At high frequencies, the propagation of the EM wave depends on multiple factors. The high frequency content of an EMP (100 s MHz) is governed by the wave propagation dependances on the characteristics of the transmission line and any topological, static, or dynamic changes of the transmission line including its characteristic impedance, source, and load impedance. While a properly designed and implemented transient suppression system (TSS) will mitigate the surge voltage and current, across the line installation introduces change of the characteristic impedance of the transmission line and reflected pulse from the TSS back to the power lines. Depending on the length of the connecting wires, portion of the transient surge pulse propagates toward the load. The portion of the pulse that reaches the TSS is reflected back to the power lines after being suppressed by the TSS and superimposed on the incoming waveform. This is illustrated with the simulation plots in FIG. 11 for two installation cases. Connection with 20 cm length wires results in about 1 ns propagation delay and the suppressed reflected wave reaches back the power lines in about 2 ns as shown in FIG. 11, plot on the left. The result for 40 cm length connecting wires is shown in FIG. 11 on the right plot. The differences of the waveforms are because of the superposition of the incoming pulse and the reflected pulse at different times (2 ns and 4 ns, respectively, after the round-trip propagation delay to the TSS and back to the power line). It is important to be noted that the incoming surge pulse propagates further down the power line towards the electrical load during the propagation delay time from the point of connection to the TSS and back to the power lines.

FIG. 12 displays an inline installation of a transient surge suppression system (TSS) which is used in the method and systems of the proposed invention. This installation does not affect the normal operation of low frequency AC power lines (60 Hz or 50 Hz) and provides the advantage with respect to the high frequency content of the transient surges. In comparison with across the lines connection, the inline installation does not result in a T-section of the electrical transmission lines. The high frequency content of an EMP (up to 300 MHz and higher) is governed by the wave propagation dependances on the characteristics of the transmission line and any topological, static, or dynamic changes of the transmission line including its characteristic impedance, source, and load impedance. FIG. 12 displays simulation example to illustrate the absence of a propagation delay and an immediate response of the TSS. The waveform at the load is almost identical to the waveform at the output of the TSS with minor losses and propagation delay that depend on the distance of the load from the inline connected TSS.

The inline installation protective means based on the current method and systems, uses components with very high resistance during normal operation, minimal parasitic capacitance, and lead inductance. As shown in FIG. 12, the protective components do not introduce an equivalent lump-element change of the characteristic impedance of the trans-mission power lines during normal operation. Please note the differences of the transient surge propagation for the inline, FIG. 12, and across the line, FIG. 11, installation.

In FIG. 13, the block diagram of a TSS is presented for an across the line installation on three-phase electric power-lines. The electric source is presented with the three phases Ph1, Ph2, Ph3, the neutral N, and the ground wire GND. The protected device is at distance L1 from the point of connec-tion of the TSS. The drawn discontinuity of the lines indicates that the distance L1 depends on the installation. The length of the connecting wires is L2 and defines the propagation delay as shown previously in FIG. 11. The transient surge suppressing assemblies (TSSA) are con-nected between each of the lines: Ph1-Ph2, Ph1-Ph3, Ph2-Ph3, each phase to the neutral wire N, and each phase to the ground wire GND.

In FIG. 14, the block diagram of a TSS is presented for an inline installation on three-phase electric powerlines. The electric source is presented with the three phases Ph1, Ph2, Ph3, the neutral wire N, and the ground wire GND. The protected device is at distance L from the point of connec-tion of the TSS. There is no propagation delay as shown previously in FIG. 12. The transient surge suppressing assemblies (TSSA) are connected between each one of the power lines: Ph1-Ph2, Ph1-Ph3, Ph2-Ph3, each phase the neutral wire N, and the ground wire GND.

The block diagrams refer to the TSSA as assemblies of transient voltage suppressors (TVSs), metal oxide varistors (MOVs), gas discharge tubes (GDTs), glass GDTs, other solid state and nonlinear components based on semiconduc-tors (i.e., Si, Ge), compound semiconductors (i.e., SiC, GaN, GaAs) and metamaterials, mechanical, electrical and ion-ization discharge devices (IDDs), and combinations thereof. The TVSs have a characteristic fast response time but relatively limited energy absorption capacity. The MOVs and GDTs provide high-capacity energy shunting capability. With the continued advancement of material sciences, opti-mized technologies produce components with better param-eters and new components that provide more advanced solutions for TSSA implementation. In this regard, the wide bandgap semiconductors, and the development of compound semiconductors with groups III-IV elements are very prom-ising to provide new components with fast response and energy handling capacity.

An example of a system embodiment based on the pro-posed method is given in FIG. 15. In the proposed method and systems, the need for low insertion loss is addressed by providing input to output current capacity conductors with very low resistance (m$\Omega$) and, if necessary, the connection of additional busbars to further decrease the resistance and losses for high current, high power applications. In FIG. 15, the 3D view of an example implementation is presented on the left and a top and side view of the assembled TSS with the input and output cable glands.

The main purpose of this invention is to provide protec-tion to electrical and electronic devices connected to an electrical infrastructure without interfering with the perfor-mance of the protected system. The TSS based on the present invention protects the connected electrical and elec-tronic loads by limiting and absorbing the energy of the transient surge pulses before they can reach the protected infrastructure. The present invention recognizes that the teachings of the related referenced patents and patent appli-cations can be extended to provide an enhanced protection from EM energy interference for high power devices con-nected at midspan and at end points of an electrical power network (EPN).

The current invention provides a method and systems for EMP protection with flexibility of installation and intercon-nection. This hybrid technology approach is based on appro-priate combination of technology elements to form surge protection assemblies which are PCB mounted as bulk components and the PCB connections to busbars with high current carrying capacity. The input and output interconnec-tion points are directly at the ends of the busbars providing inline installation at different gage wires as shown in FIG. 16, FIG. 17, and FIG. 18. An exploded view of the example implementation is given in FIG. 19. FIG. 20 illustrates the method based on the current invention to connect two TSSs back-to-back to double the energy handling capacity of the TSS inline installation. Further description and details are given below in this document.

The embodiment example given in FIG. 16 displays an implementation for two 120 VAC lines used to provide 240 VAC to higher power utilities. Additional views of subas-semblies of the example implementation are presented in FIG. 17 to FIG. 20. For the 240 VAC inline installation four busbars are needed to make connections with the L1, L2, neutral and ground conductors of the power line. Adding a fifth busbar is necessary for a three-phase power line as illustrated schematically with the block diagrams in FIG. 13 and FIG. 14. The reconfiguration flexibility is further illus-trated with the ability to connect different input plugs and output receptacles or outlets as illustrated with an example in FIG. 21.

FIG. 21 displays a plurality of commonly used standard plugs and receptacles with their respective voltage and current rating. The method and system provided in this invention enable utilization of any combination of plug and receptacle for the appropriate voltage and current rating. FIG. 23 displays the commonly used connector types for electric vehicles (EV) in North America, Europe, Japan, China, and all Tesla's markets. The TSS based on the current invention can easily interconnect to the DC or AC power wires of any of the EV's charging cables for an inline installation.

FIG. 24 displays different meter socket adapters with a top view of the enclosure adapters jaws intended for installation between a meter socket and the utility meter. The meter socket adapters contain additional bus bars, protective devices, metering, communications, and other associated equipment and primarily serves as an S-base meter socket. The meter socket adapters are very suitable to utilize of the reconfigurable inline system for EMP protection. The physi-cal dimensions and electrical aspects are covered by ANSI/NEMA C12.7 Requirements for Watthour Meter Sockets and C12.10 Electromechanical Watthour Meters.

SUMMARY OF THE INVENTION

Embodiments of the invention are defined by the claims below and not solely by this summary. A high-level overview of various aspects of the invention is given here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for protecting high current (high power) electrical systems from electromagnetic pulse-induced electrical transient surges induced by the E1, E2, and E3 components of an electromagnetic radiation complex multi-pulse, generated by the detonation of a nuclear weapon at high altitude (HEMP), intentional electromagnetic interference (IEMI) or a Geo-magnetic disturbance (GMD) produce by a coronal mass ejection (CME).

In one aspect, the system and method for suppressing electromagnetic pulse-induced electrical system surges comprises a plurality of limiting, absorbing, and shunting assemblies including transient voltage suppressors (TVSs), metal oxide varistors (MOVs), gas discharge tubes (GDTs), glass GDTs, other solid state and nonlinear components based on semiconductors (i.e., Si, Ge), compound semiconductors (i.e., SiC, GaN, GaAs) and metamaterials, mechanical, electrical and ionization discharge devices (IDDs), and combinations thereof. The protecting assembly (limiting, absorbing, and shunting) are connected to the power transmitting lines without interfering with the normal operation of power transfer to the respective electrical power devices. The method for EM surge protection is implemented in such manner that voltage amplitudes between any two lines that exceeds a predetermined level are limited, absorbed, and shunted by at least one of the pluralities of protecting assembly to prevent the voltage amplitude from exceeding a predefined desired level. By limiting the voltage amplitude, respectively the current of the connected electrical power devices is also limited preventing a damaging effect of a transient voltage surge.

In another aspect, the inline mounting of the reconfigurable surge suppression system eliminates any delay response time of the plurality of protecting assemblies and the allowable voltage amplitude level of the protecting assemblies are selected and combined to achieve a predefined desired response time and protection level capacity to react to and mitigate the E1, E2, and E3 components of a complex multi-pulse EMP pulse generated by detonation of a nuclear weapon at high altitude (HEMP). In a similar aspect, the response time and the voltage limiting and energy handling capacity of the plurality of protecting assemblies responds to electromagnetic energy induced by a GMD or IEMI.

In a further aspect, the presented method and reconfigurable interface systems provide surge protection of phase line-to-ground wire, phase line-to-neutral wire and phase line to phase line wires with ability to utilize plurality of interfaces for inline connection.

In alternative embodiments, the system and method of the present invention are configured to protect electrical systems operating at different AC or DC voltages. The surge suppressing system embodiments are mounted on a PCB and sealed with electrically insulated, thermally conductive compounds with designed connections of the PCB busses to external high current capacity busbars. Terminals at the end points of the busbars provide access connection points to input and output power line wires. This forms a reconfigurable TSS with the ability to utilize any of the standard plugs and receptacle for an inline installation at midspan and at endpoints of electrical distribution networks. An additional auxiliary ground connector is provided for an augmented grounding installation. Two TSSs can be connected back-to-back to double the surge energy handling capacity. Furthermore, mechanical, and waterproof sealed embodiments can be installed inline and used in submersible and underground electrical power networks.

BRIEF DESCRIPTION OF THE DRAWINGS

Illustrative embodiments of the invention are described in detail below with reference to the attached drawing figures, and wherein:

FIG. 6 is a tabulated summary of the commonly used analytical expressions for the HEMP E1, E2, and E3 waveforms with the model parameter values;

FIG. 7 is a table with the parameter values for the HEMP E1 waveform and their changes as the models and standards describing the HEMP E1 environment have evolved;

FIG. 8 is a table of additional HEMP E1 waveform characteristics;

FIG. 22 presents a table of standard plugs and receptacle defined by the National Electrical Manufacturers Association (NEMA); and FIG. 23 presents three tables with summary information about currently used inlets and connectors for electric vehicle charging, their voltage, current, and power rating, and respective governing standards.

FIG. 24 presents different meter socket adapters with top views of the enclosure adapters jaws intended for installation between a meter socket and the utility meter, offering a utility for inline installation of EMP surge protection with reconfigurable interface to meet the physical and electrical standards.

DESCRIPTION OF THE PREFERRED EMBODIMENT

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

The characteristics of an electromagnetic pulse (EMP), in general, and high-altitude nuclear EMP (HNEMP), in particular, is discussed in the context of traditional electrical environments and setups before described in detail and in context the fundamentals of the present invention regarding the protection of multiplicity of high power electrical and electronic systems.

Figure 1:
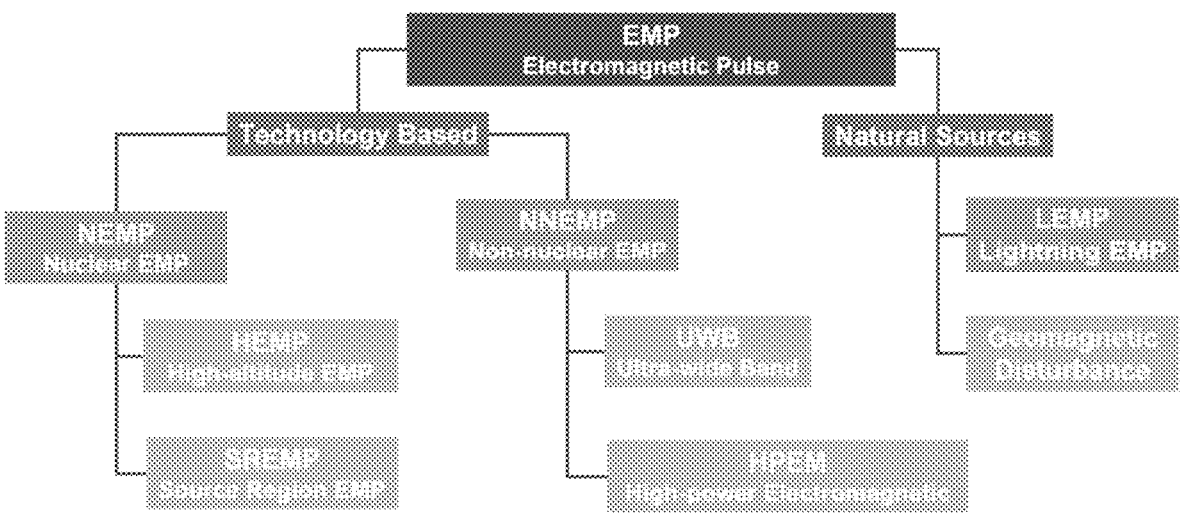
FIG. 1 is a view diagram of the sources of powerful electromagnetic surges, such as electrical grid circuit switching, natural lightning strikes, electromagnetic interference (EMI) coupling, electrostatic discharge (ESD), directed energy weapons (DEW) sources, nuclear electromagnetic pulses (NEMP), and geo-magnetic disturbance (GMD)
Figure 2:
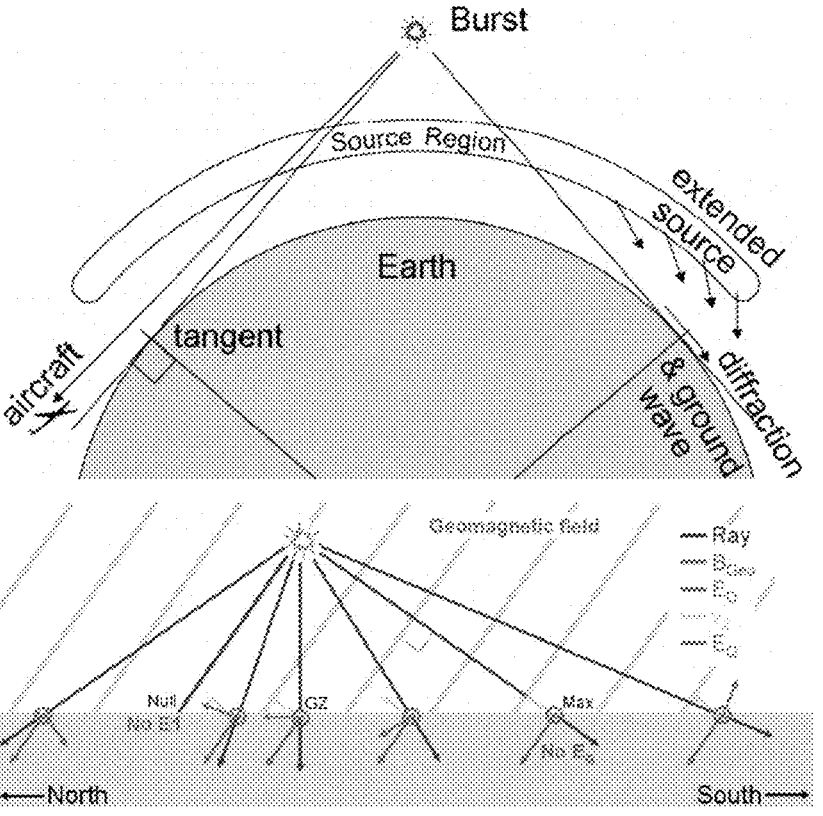
FIG. 2 is a pictograph of an electromagnetic pulse generated by a high-altitude nuclear explosion (HEMP) and the formation of the Source region in the atmosphere.
Figure 3:
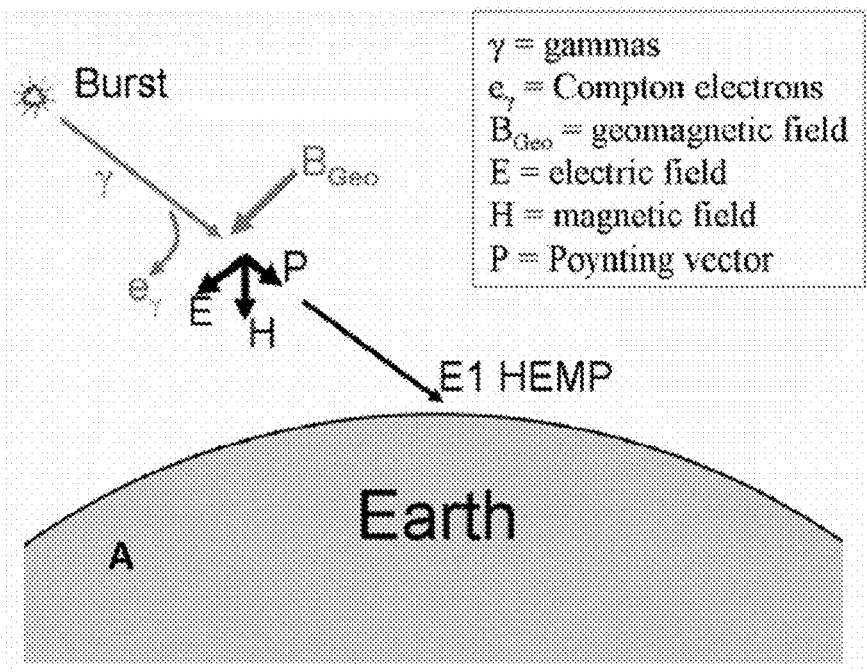
FIG. 3. is a pictograph of the nuclear burst high-altitude location and the Electromagnetic Field (EMF) Poynting vector direction with respect to the observer's location.
Figure 4:
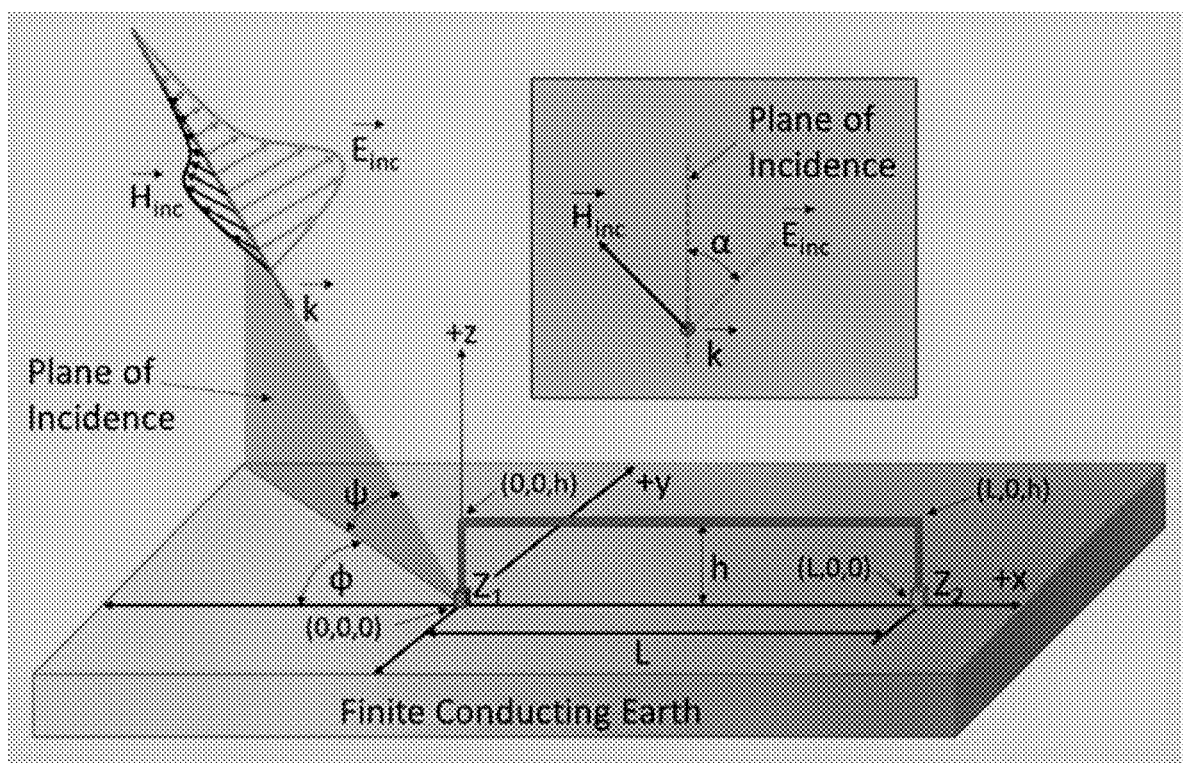
FIG. 4 illustrates the EM wave and its E (electric) and H (magnetic) vectors in the plane of incidence at a transmission wire at height h. The three associated angles ($\alpha$, $\phi$, and $\psi$) are indicative for the importance of 3D monitoring and evaluation of the Electromagnetic field (EMF)

As initially presented above and summarized in FIG. 1, an EMP is associated with naturally occurring or man generated events. An EMP generated by detonation of a nuclear weapon comprises a sequence of waveforms due to the multiple and complex interactions of the product of the nuclear blast with Earth's atmosphere and geomagnetic lines (FIG. 2 and FIG. 3). Multiple phases (pulses of varying duration) are used to describe/represent the HEMP more accurately. In this regard, the HEMP is considered a complex, electromagnetic multi-pulse, usually described in terms of three primary components defined by the International Electrotechnical Commission (IEC) as E1, E2, and E3. The three phases of the HEMP are presented in FIG. 5A. The nature of these pulses is described below.

The E1 component of the complex multi-pulse is produced when gamma radiation from the nuclear detonation knocks electrons out of the atoms in the upper atmosphere. The electrons begin to travel in a generally downward direction at relativistic speeds (i.e., at more than 90 percent of the speed of light). In the absence of a magnetic field, the displaced electrons would produce a large pulse of electric current vertically in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very brief, but very high magnitude, electromagnetic pulse over the affected area.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The strength of the E1 HEMP depends upon the altitude of the detonation of the nuclear device and the atmosphere conditions and to the intensity of the gamma rays produced by the weapon. of the more detailed explanations of the undergoing physical interactions are beyond the scope of this document and may be found elsewhere.

The interaction of the very rapidly moving negatively charged electrons with the magnetic field radiates a short duration, intense pulse of electromagnetic energy. The pulse typically rises to its peak magnitude in about five nanoseconds (5 ns) and decays within hundreds of nanoseconds (200 ns-500 ns, depending on the level of intensity used for measurement). The given values may vary based on location and distance to the blast point. According to the most recent IEC standard update, the E1 pulse has a rise time of 2.5 ns±0.5 ns (from 10% to 90% amplitude levels), reaches peak value of 50 kV/m in 5 ns, and has a pulse width at half maximum of 23 ns±5 ns (FIG. 7 and FIG. 8).

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to respond and suppress the surge induced into an electrical system by an E1 pulse.

The E1 component is further characterized in certain regulatory standards. The table in FIG. 8 gives the characteristic values of the E1 phase of the HEMP. There are several HEMP environment standards, and some are classified such as DoD-STD-2169. Others are public knowledge such as IEC STD 61000-2-9, MIL-STD-188-125-1, MIL-STD-461G, and MIL-STD-464C. The first HEMP related standard was created by Bell Labs in the 1960s. Since then, revisions have been made as can be seen from the table 1 in FIG. 7. In general, the parameter values do not present geolocation variations with respect to altitude, distance, atmosphere conditions, field vectors direction, and local Earth surface properties, which impact the formation, propagation, and reflection of the EM field.

Figure 5A:
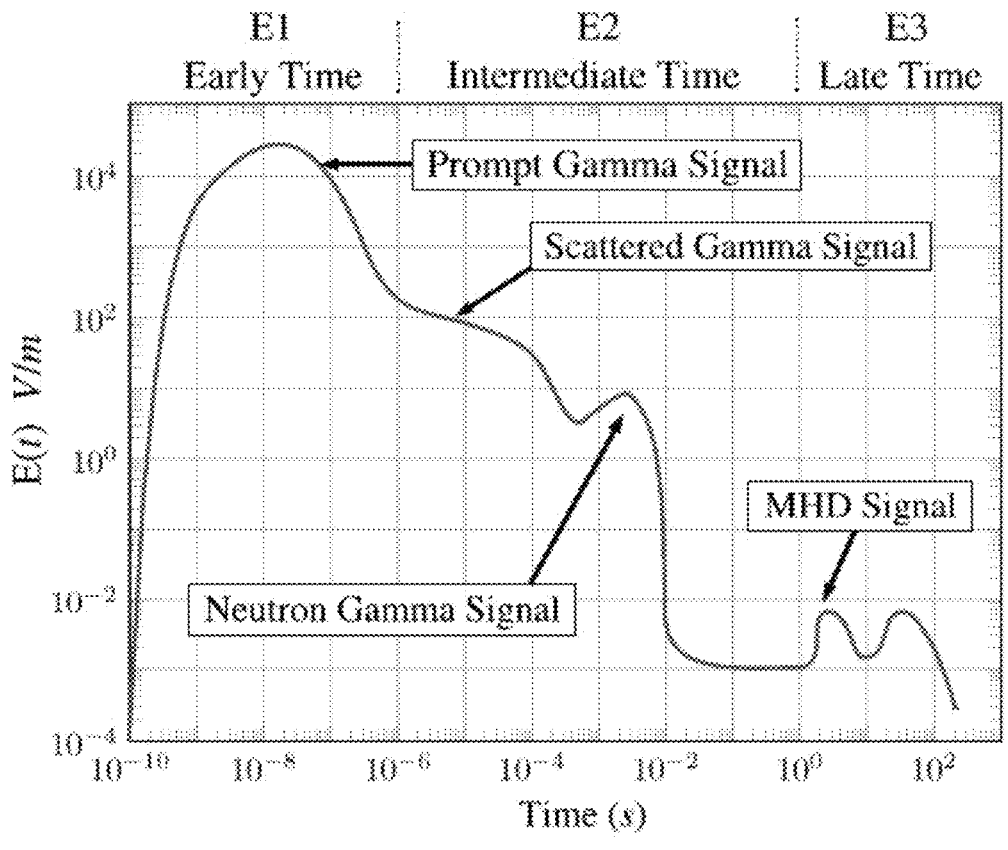
FIG. 5a is a plot representation in time domain of the complex high-altitude electromagnetic multi-pulse event with a sequence of three primary E1, E2, and E3 phases of the HEMP.
Figure 5B:
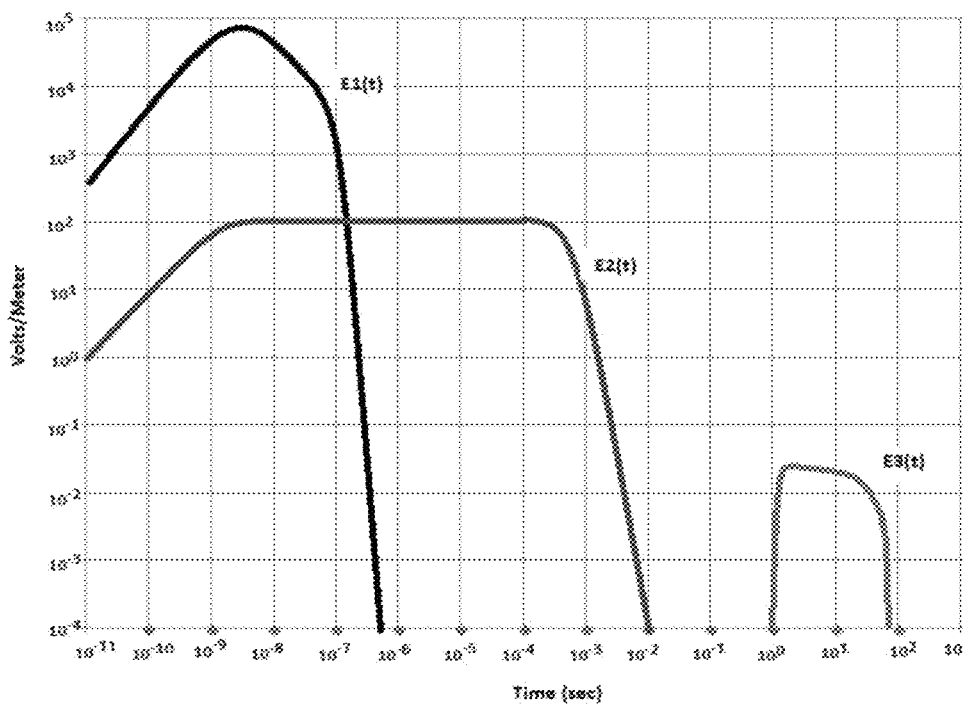
FIG. 5b is a plot representation in frequency domain of the spectral magnitude and spectral content of three primary E1, E2, and E3 phases of the HEMP.
Figure 9A:
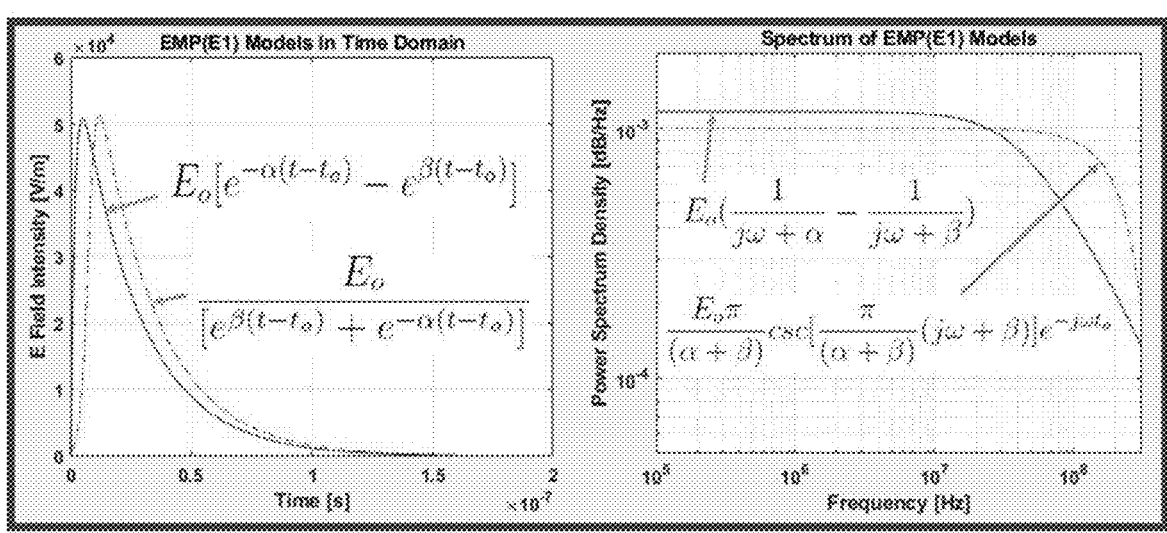
FIG. 9A presents the plots of the Difference of double exponential (DEXP) and the Quotient of exponentials (QEXP) models of HEMP E1 in time domain (left) and their respective spectral distribution in frequency domain (right)

The combined HEMP timeline based on analytical expressions is provided in IEC 61000-2-9 and is given in FIG. 5A. Two of the well accepted and used analytical expressions of HEMP are provided in IEC 61000-2-9 and given for reference in FIG. 9A. Unclassified HEMP standards characterize the E1 phase of the EMP by idealized Difference of double exponentials (DEXP) and quotient exponential (QEXP) waveforms, as shown in FIG. 9A with the blue solid line and red dash-dot line, respectively. The EMP E1 model waveforms are given in time-domain (left) and their respective spectral content (right). The evolution of the E1 HEMP standards is presented in FIG. 7. The $\alpha$ and $\beta$ are the exponential constants and k is a normalizing constant for the peak amplitude at the cross section of the two exponentials. In addition to the DEXP and QEXP, two other analytical forms have been developed and presented in the literature: the P-index exponential (PEXP) and the Complimentary error function (ERFC). The main reason for these additional analytic models is some of the deficiencies of the first two models. For example, the DEXP model is discontinuous at t=0, while QEXP extends to t=∞ and has an infinite number of poles in frequency domain. To rigorously explore the models, the author of this application has developed software to interactively demonstrate and compare the different models. In addition to the published models (DEXP, QEXP, PEXP, and ERFC), three new models were developed based on Log-normal, Beta, and Gamma distributions. The software was used to visualize and study the characteristics of HEMP waveform models in time domain, frequency domain, and joint time-frequency domain.

The method and devices based on the method described in this invention are based on specifications listed in the Military and Civilian Standards and are developed accordingly for accurate description of E1, E2, and E3 pulse components of a HEMP. The standards are used to design and build test facilities to study the impact of HEMP effects and to design, implement, and evaluate the level of protection of devices built for mitigation of the effects. The author has developed software tools to generate and analyze the waveforms described in all publicly available standards. Theoretical and experimental exercises were conducted to investigate waveforms with parameters exceeding the current standards considering worst case scenarios.

The HEMP standards are derived by considering many possible waveforms in time and frequency domains. Mathematical models are created that best express the temporal and the spectral characteristics. The detection of E1 EMP is the most challenging, requiring ability to monitor the sensors' signals with sub-nanosecond resolution (10 s of picoseconds). The two models for the E1 HEMP given in FIG. 9A have their advantages (simple analytical forms) and disadvantages: the double exponential model is discontinuous at t=0, while quotient exponential has the advantage of a continuous time derivatives for all orders but also the disadvantage of in that it extends to t=∞ and has an infinite number of poles in the frequency domain. The model waveforms are useful for testing, but they do not present with high fidelity the complexity of the real HEMP E-field waveforms.

Figure 9B:
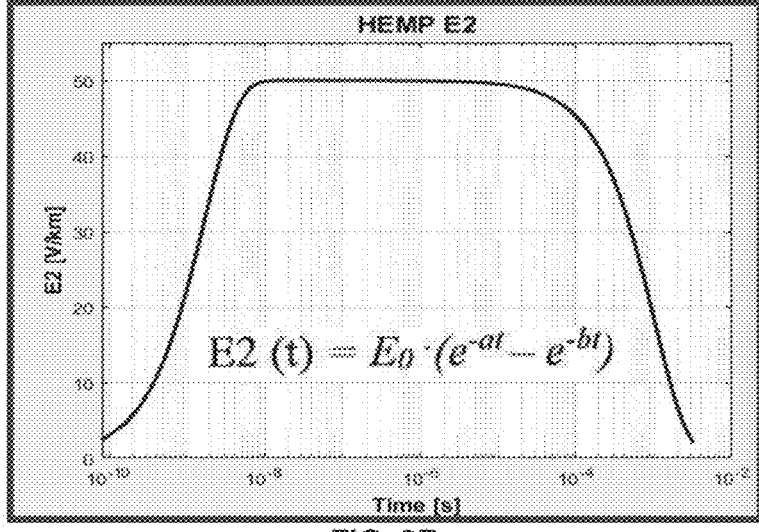
FIG. 9B displays the waveform of the E2 HEMP and its analytical expression.

The most critical aspects regarding the HEMP are its propagation speed, broad bandwidth, and high energy. Protection against the hazardous effects of HEMP E1 phase must be achieved in real time with fast response (2.5 ns rise time). It is followed by the E2 and E3 components of the HEMP. In this regard, an accurate detection of E1 can be used to activate robust isolation protection from the consecutive E2 and E3 phases. The E2 component of the pulse has many similarities to an electromagnetic pulse produced by lightning, although the electromagnetic pulse intensity induced by a very close-proximity lightning strike may be considerably larger than the magnitude of the E2 component of a nuclear HEMP (FIG. 9B).

Because of the similarities to lightning-caused electromagnetic pulses and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that it immediately follows an E1 component which likely has damaged any devices that were intended to protect against a lightning strike type surges and that could have potentially protected against an E2 component pulse alone. As noted in the United States EMP Commission's Executive Report of 2004, referring to the E2 component pulse, "[I]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

Figure 9C:
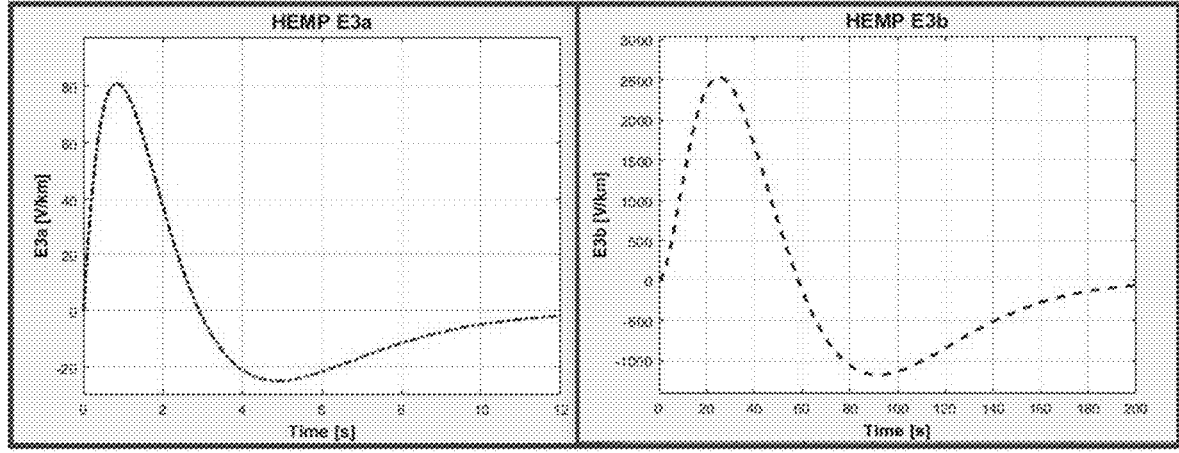
FIG. 9C displays the waveforms associated with the two phases of E3 HEMP. Additional analytical expressions and models have been developed but they are beyond the scope of this application.

The E3 component of the complex multi-pulse is a pulse with a very long rise and fall times, long period of oscillations, and lasts tens to hundreds of seconds (FIG. 9C). It is caused by the nuclear detonation heaving the Earth's magnetic field out of the way, followed by the restoration of the magnetic field to its natural state. The E3 component has similarities to a geomagnetic storm caused by a very severe solar corona mass ejection (CME), or stellar-induced EMP's from stellar gamma ray burst sources, supernova, hypernova and collisions of neutron stars. Like a geomagnetic storm, an E3 pulse can produce geomagnetically induced currents in long electrical conductors, which can then damage or destroy components such as high voltage power line transformers. The E3 induced currents are often called quasi-DC currents because by their time domain properties they resemble extremely low frequency waveforms (ultra-long wavelengths) inducing DC-like currents into the long power transmission lines. Nearly all major damage from HEMP E3 in modern infrastructure will occur to systems and substations of the electrical power grid, which is generally not designed to handle direct currents. The vulnerability is especially high for critical devices such as high voltage power transformers.

Figure 10:
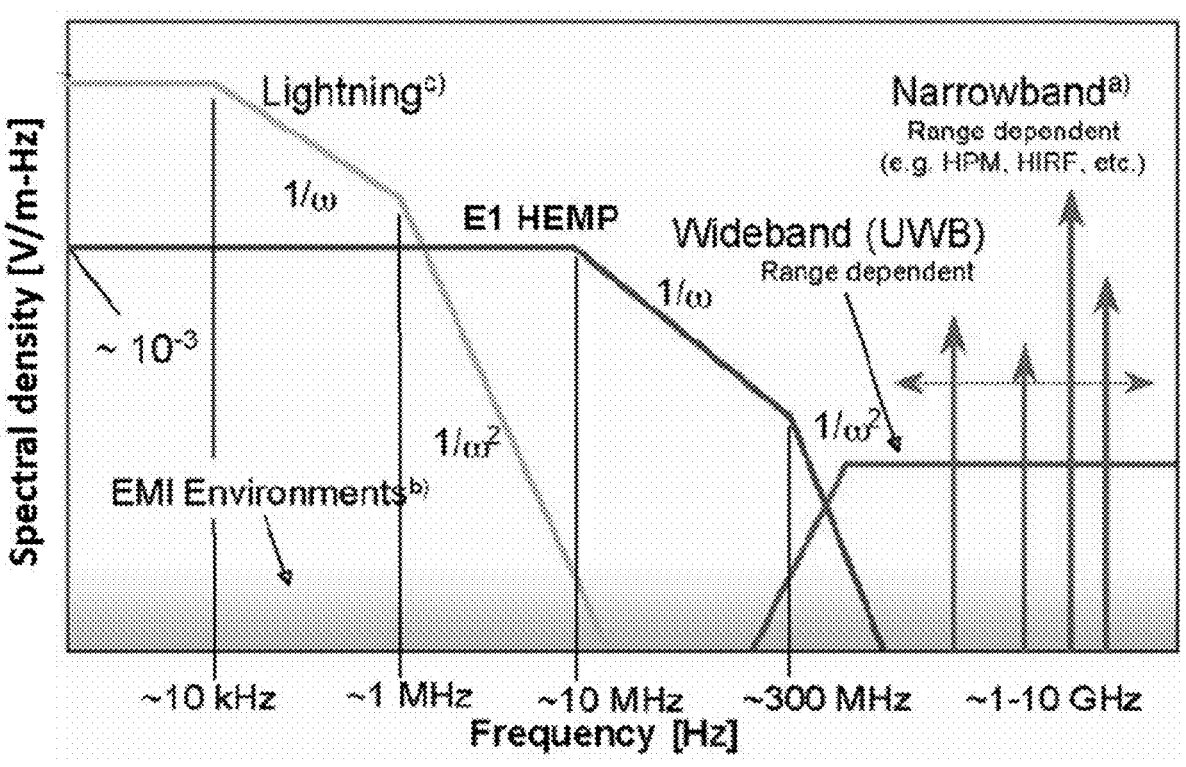
FIG. 10 illustrate the power spectrum density (V/m-Hz) associated with a HEMP E1, an atmospheric lightning, and IEMI (high-power microwave, high-intensity RF)

Looking to FIG. 10, the HEMP E1 has the broader spectral content than E2. While the HEMP E2 has similarity with lightning generated EMP, in proximity, the intensity of the field from lightning exceeds the E2 field strength. The intentional electromagnetic interference may have narrow or wideband spectrum and very different intensity levels.

Figure 11:
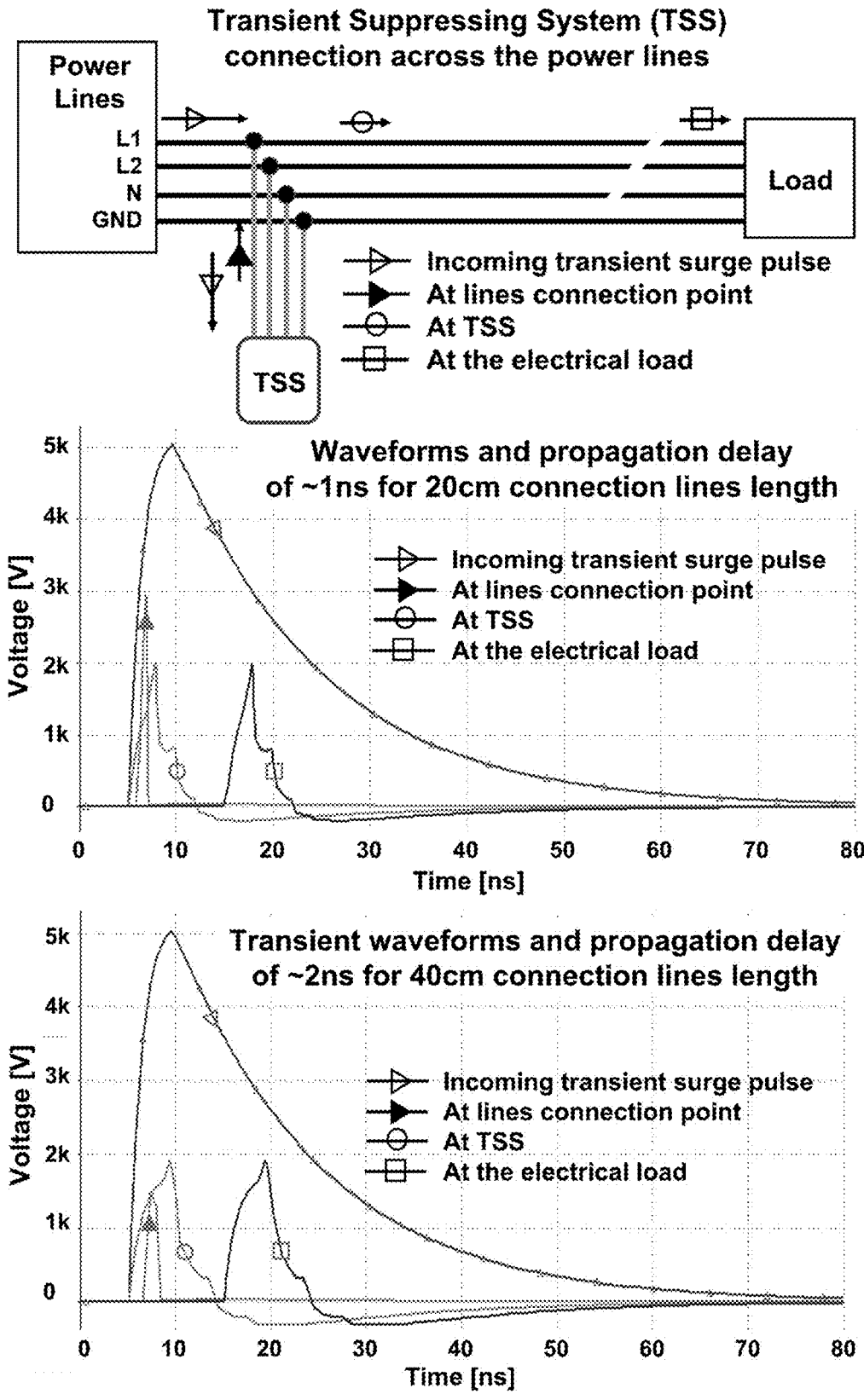
FIG. 11 displays a generalized view of surge protection installation across the power lines and the simulated waveforms at different points of the power lines.

Looking to FIG. 11, a generalized view of transient surge protection installation across the power lines of a 240 VAC power line is displayed. The simulated waveforms at different points of the power lines from the source to the electrical load are displayed in the plots. The incoming surge pulse on the lines, the modified wave at the transient surge suppressor (TSS), the superimposed waves at the point of connection, and the waveform reaching the load are presented for two different lengths of the connecting wires of the TSS. The propagation delay depends on the frequency content of the waveform and the characteristic parameters of the transmission line. The presented simulation results are for one nanosecond and two nanosecond propagation delays from point of connection to the TSS (approximately 20 cm and 40 cm wire length, respectively). The suppressed reflected wave reaches the connection point after two and four nanoseconds respectively. The legend in the figure indicates the waveforms at different points on the line and the respective waveforms on the plots. The main point is to illustrate that the incoming transient surge wave propagates towards the electrical load before the TSS starts to react to the transient surge wave.

Figure 12:
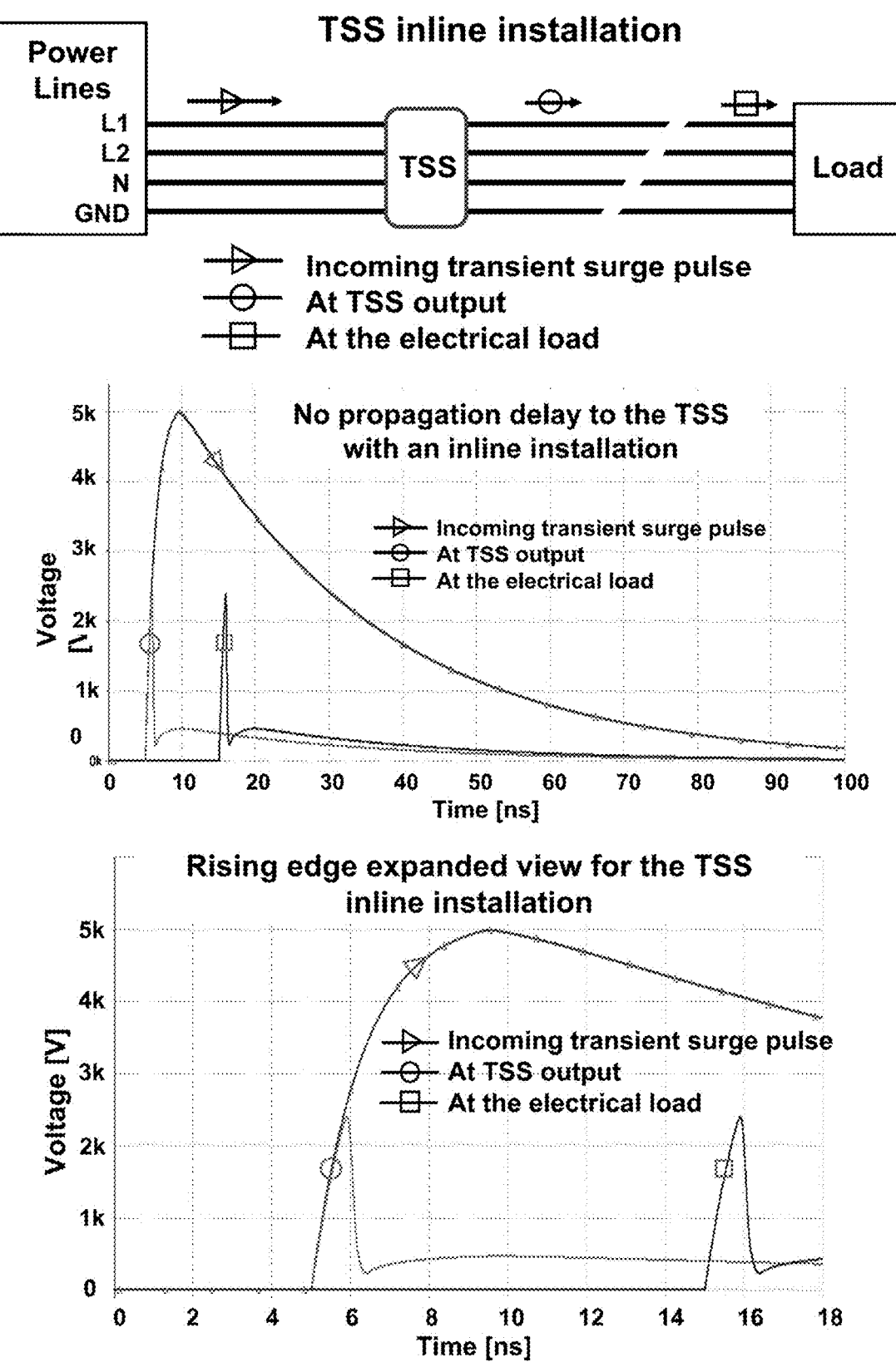
FIG. 12 displays an inline installation of a transient surge suppression system (TSS) and the simulated waveforms at different points of the power lines.

Looking to FIG. 12, a generalized view of transient surge protection in line installation is displayed. The simulated waveforms at different points of the power lines from the source to the electrical load are displayed in the plots. The incoming surge pulse on the lines, the modified wave at the output of the inline transient surge suppressor (TSS), and the waveform reaching the load are presented. The legend in the figure indicates the waveforms at different points on the line and the respective waveforms on the plots. There is no propagation delay from connection point (in line insertion point in this case) to the TSS and, respectively, there is no reflected waveform. The main point is to illustrate that the TSS reacts immediately to the transient surge wave, absorbs, and redirects most of the energy, and only suppressed waveform propagates towards the electrical load.

Figure 13:
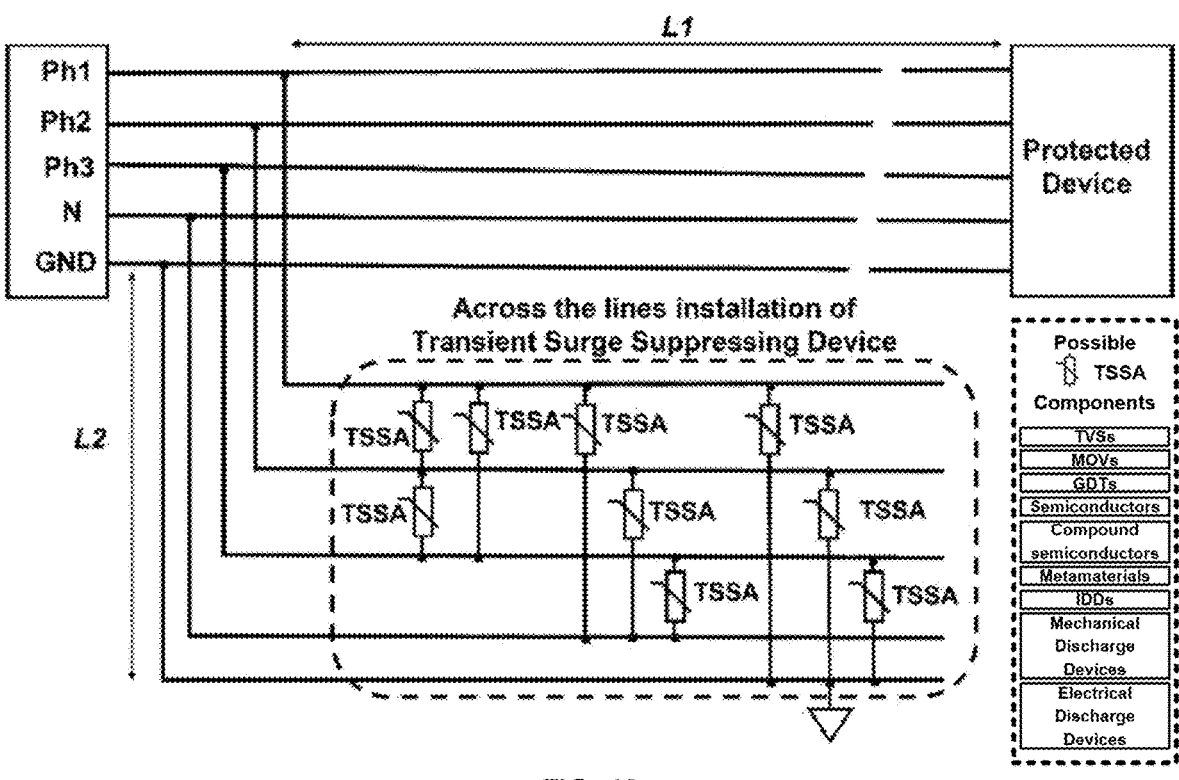
FIG. 13 presents the block diagram of an across the line installation of a TSS on three-phase electric power lines with the transient surge suppressing assemblies.

Looking to FIG. 13, the block diagram for across the lines installation of a TSS on three-phase electric power lines is displayed with the transient surge suppressing assemblies (TSSA) connected between pairs of power line conductors: Ph1-Ph2, Ph1-Ph3, Ph2-Ph3, each phase wire to the neutral wire conductor, and each phase wire to the ground wire conductors. The TSSA block represents a plurality of limiting, absorbing, and shunting assemblies, including transient voltage suppressors (TVSs), metal oxide varistors (MOVs), gas discharge tubes (GDTs), glass GDTs, other solid state and nonlinear components based on semiconductors (i.e., Si, Ge), compound semiconductors (i.e., SiC, GaN, GaAs) and metamaterials, mechanical, electrical and ionization discharge devices (IDDs), and combinations thereof. As shown in the figure, the protected device is at a distance L1 from the point of connection and the TSS input terminals are connected using wires with length L2.

Figure 14:
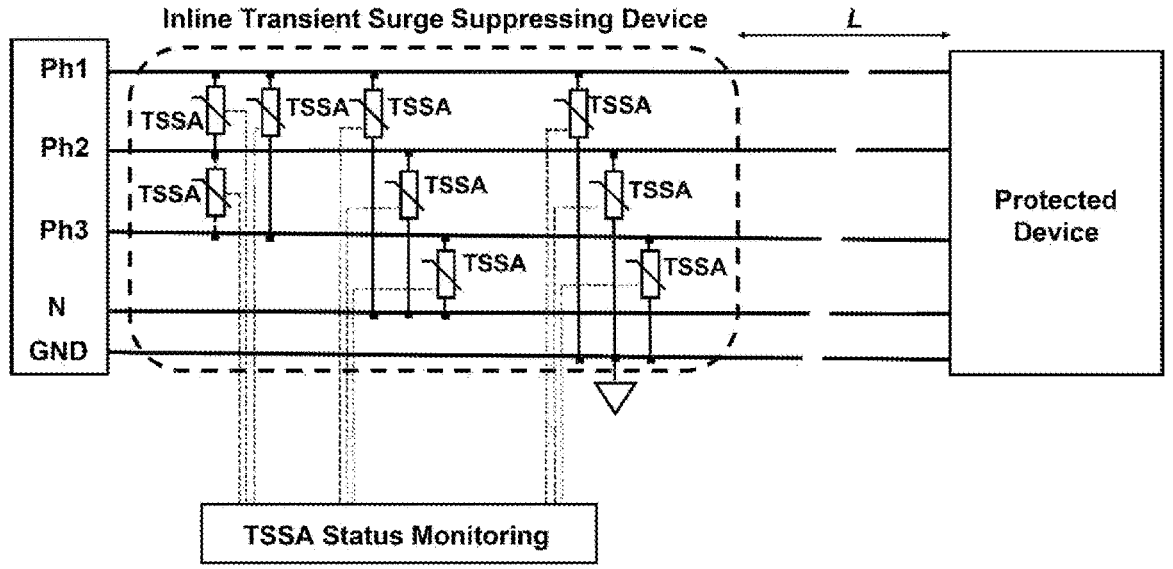
FIG. 14 presents the block diagram of an inline installation of a TSS on three-phase electric powerlines with the transient surge suppressing assemblies.

Looking to FIG. 14, the block diagram for inline installation of a TSS on three-phase electric power lines is displayed with the transient surge suppressing assemblies (TSSA) connected between pairs of wires: Ph1-Ph2, Ph1-Ph3, Ph2-Ph3, each phase wire to the neutral wire, and each phase wire to the ground wire. The TSSA block represents a plurality of limiting, absorbing, and shunting assemblies, including transient voltage suppressors (TVSs), metal oxide varistors (MOVs), gas discharge tubes (GDTs), glass GDTs, other solid state and nonlinear components based on semiconductors (i.e., Si, Ge), compound semiconductors (i.e., SiC, GaN, GaAs) and metamaterials, mechanical, electrical and ionization discharge devices (IDDs), and combinations thereof. An additional block for TSSA Status Monitoring subsystem is presented in the block diagram, The electronic circuit of the Status Monitoring subsystem is connected to the electronic sensors and components associated with each TSSA and the connections are presented with dashed lines.

The status monitoring, displaying, and communication is described with details in the referenced patents and patent applications.

As shown in FIG. 14, the protected device is at a distance L from the point of connection (in line insertion) of the TSS. The proposed method for inline reconfigurable and systems based on the method include TSSAs that are soldered to tick traces on a printed circuit board (PCB) with thick coat of solder. Trough hole mounting is used in combination with surface mounting for some components. Tin plated busbars are embedded for increased current carrying capacity and thermal conductivity. The TSS includes soldered screw terminal on the bottom side of PCBs' traces for connection to external busbars using screws.

Figure 15:
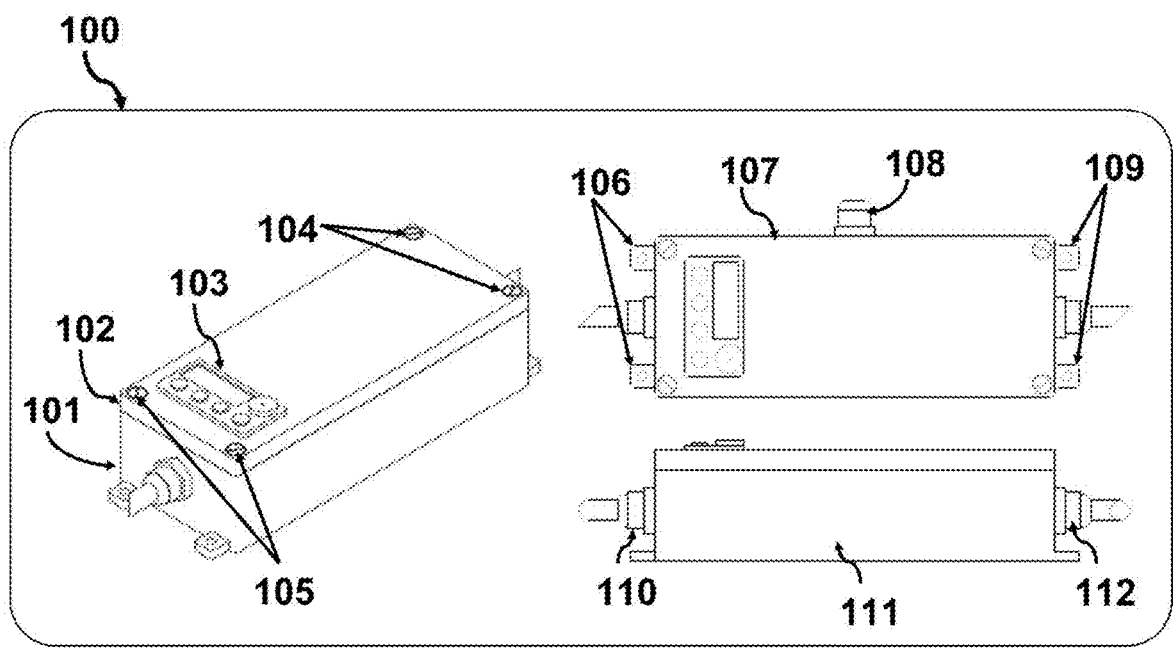
FIG. 15 presents an example of a system embodiment based on the proposed method illustrated with a 3D view, a top view, and a side view of the assembled and enclosed TSS.

Looking to FIG. 15, an example collection 100 of 3D and 2D drawings is presented of a transient suppressing system (TSS) embodiment based on the proposed method. Without any limitations, the example is for a 240 VAC power line with four wires. The 3D drawing on the left side of FIG. 15, displays the bottom part 101 of the TSS enclosure and its top cover 102 with a panel mounted audio-visual annunciator 103. The top cover 102 is attached to the bottom part 101 of the enclosure with screws 104 and 105. On the right upper corner of the figure, a top view 107 of the TSS is displayed. The external enclosure mounting brackets 106 and 107 and an auxiliary ground connector 108 are displayed at the side of the enclosure. The auxiliary ground connector 108 is used to provide an additional pathway to ground when connected to the grounding system during installation of the TSS. On the right lower corner in FIG. 15, a side view 111 of the TSS is displayed with the cable glands 110 and 112.

Figure 16:
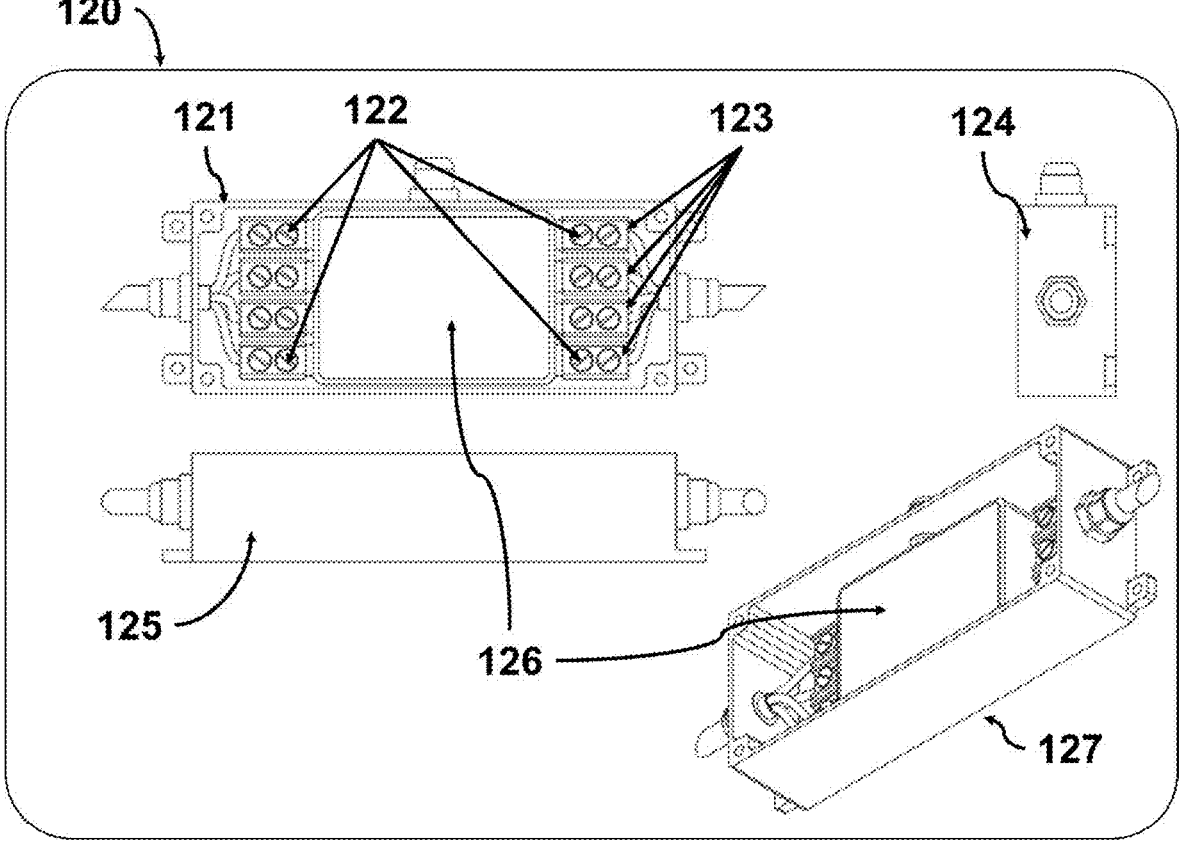
FIG. 16 displays a top view of the open enclosure of the example embodiment with additional side, frontal, and 3D views.

Looking to FIG. 16, a drawing collection 120 of 3D and 2D top and side views of the TSS embodiment are displayed. In the top left corner of FIG. 16, the top view of the open TSS enclosure 121 is displayed with its cover (102 in FIG. 15) removed. The terminal screw blocks 122 indicates two groups with four terminal connectors each. The screw terminals 122 are used to connect the four wires of the 240 VAC power line at the input and output of the TSS enclosure to the busbars 123 using threaded holes.

In the proposed method and reconfigurable systems based on the method, the need for low insertion loss is addressed by providing input to output high current capacity conductors, busbars 123, with very low resistance (mΩ). When necessary, the addition of stacked busbars 123 is provided for the reconfigurable system to further decrease the resistance and insertion losses for high current, high power applications using inline TSS installation.

On the left bottom corner of FIG. 16, a side view 125 of the TSS enclosure is displayed. On the right upper corner of the figure, a frontal view 124 of the TSS enclosure is displayed. On the right lower corner in FIG. 16, a top angle view 127 of the TSS open enclosure is displayed. TSS 126 is shown in the upper left corner of FIG. 16 with a top view of the open enclosure 121 and in the lower right corner of the figure with a 3D top angle view 127 of the open TSS enclosure 121. TSS 126 contains encapsulated all transient surge suppressing assemblies (TSSA) referred to in FIG. 13 and FIG. 14.

Figures 17, 18:
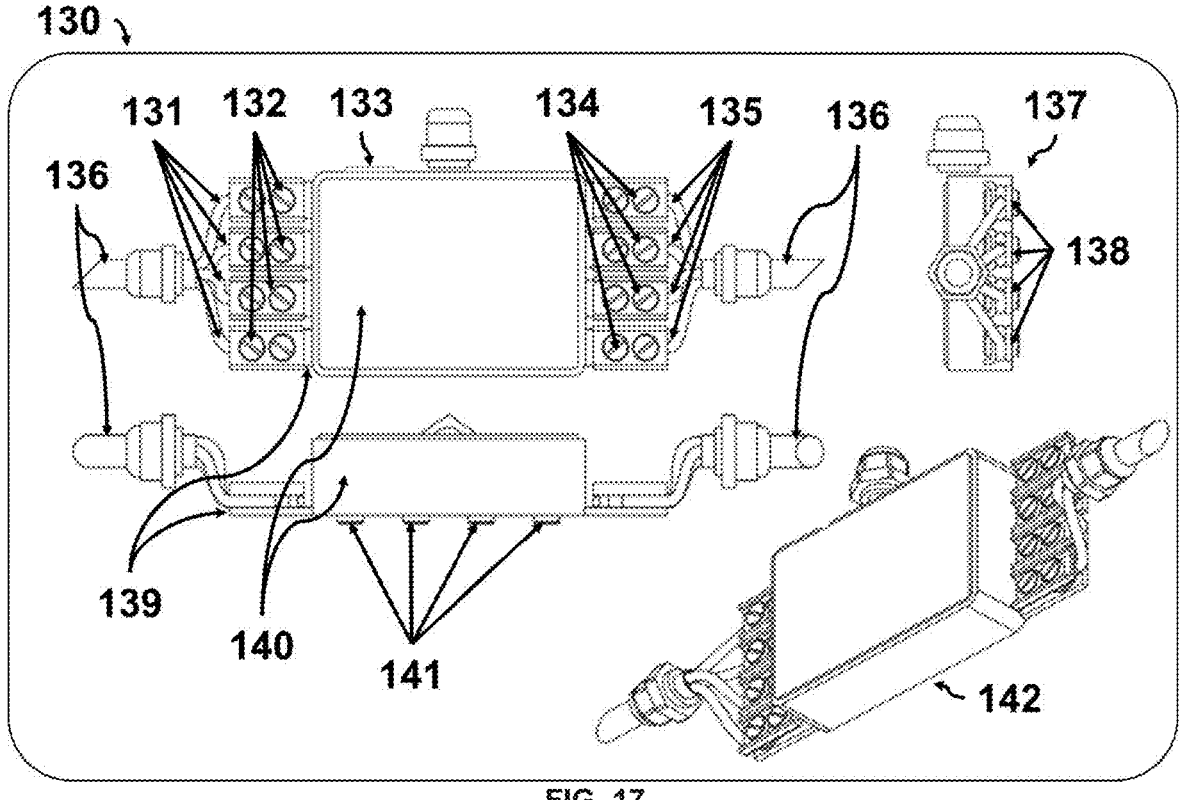
FIG. 17 provides a top view of the example embodiment with additional side, frontal, and 3D views without the enclosure of the TSS.
FIG. 18 illustrates the busbars and connection endpoints from different viewing angles.

Looking to FIG. 17, a collection of drawings 130 of TSS subassemblies is presented without the enclosure to better visualize the components of the TSS. In the top left corner of the figure, the top view of the TSS 140 is presented with the input and output electrical cables 136, each having four input electrical line conductors 131 and four output electrical line conductors 135. The input and output electrical cables 136 pass through the cable glands of the TSS enclosure (110 and 112 in FIG. 15). The four input electrical line conductors 131 are securely connected with the screw terminals 132 to the front end of busbars 139. At the other end of the busbars 139, screw terminals 134 securely connect the four output electrical line conductors 135 of the output cable 136 to the busbars 139.

TSS subassembly 140 contains the transient surge suppressing assemblies (TSSAs, referred to in FIG. 13 and FIG. 14), encapsulated using electrically insulating, thermally conductive compound material. An electronic circuit is also embedded in TSS subassembly 140 to provide signals for the status of the TSSAs to connector 133 on the side of TSS subassembly 140 and used to connect and display the status of the TSSAs on the audio and visual annunciator (103 in FIG. 15) on the front panel (102 in FIG. 15) of the transient suppressing system (101 in FIG. 15).

The TSS subassembly 140 is connected to the busbars 139 using connectors 141. In the top right corner of FIG. 17, the frontal view drawing 137 of the TSS 140 is displayed with the side view 138 of connectors 141. In the lower right corner, a 3D angle view 142 is displayed. Screws are used for connectors 141 when the printed circuits boards (PCBs) have threaded holes soldered on the thick traces with a tick coat of solder. The screw connectors may be used in addition to soldering pre-assembly for improved conductivity contact and mechanical strength.

In general, the TSSs based on the proposed method for reconfigurable systems is a symmetric system with respect to their input and output. The symmetry implies that input and output are equivalent for inline installation if the 120 VAC lines L1, L2, and the neutral and ground power line conductors are properly connected to the designated busbars with respective screw terminals. In specific embodiments, the input and output are explicitly specified and properly marked.

Looking to FIG. 18, a collection of drawings 150 of the TSS subassemblies is presented without the TSS (140 in FIG. 17) to better visualize the busbars 153 subassembly (139 in FIG. 17) with the mounting connections that provide the reconfigurable flexibility of systems based on the proposed method. In the top left corner of the figure, the first group of screw terminals 152 securely connect the power line conductors to the busbars 153 using its threaded busbar holes. The screw terminals are shown as 158 on the frontal view 157 of the subassembly. The TSS is not displayed and the mounting holes 154 of the busbars 153 are visible. The holes are used to securely attach the sealed TSS (140 in FIG. 17) to the busbars 153 using the conducting connectors 160. The sealed TSS contains all TSSAs which are mounted on a PCB and encapsulated with electrically insulating, thermally conductive compound. The TSS is not shown in the drawings and the screw terminals 152 and 155, and the busbars 153 with mounting holes 154 illustrate the embedded reconfiguration flexibility as well as manufacturing modularity provided by the proposed method. In the lower right corner of FIG. 18, a 3D angle view drawing 161 of the busbars subassembly with the mounting connections is displayed to further illustrate the example embodiment.

At the two ends of the busbars 153, the screw terminals 152 and 155 connect the power line conductors after the cables pass through the cable glands 151 and 156, respectively. The TSS (140 in FIG. 17) is connected to the busbars 153 using only screws 160 for some applications, or using soldering that is additionally conductively and mechanically reinforced with screw connectors 160. The TSS contains the encapsulated TSSAs mounted on a PCB with tick traces coated with thick solder and mounting threaded holes soldered on the bottom side of the PCBs' traces. The proposed method provides implementation with the option to add multiple stacked busbars 153 to increase the current carrying capacity in high power applications with low insertion loss. For example, fast DC charging of electric vehicles is rated with maximum current of 600 A and 90 kW.

Figure 19:
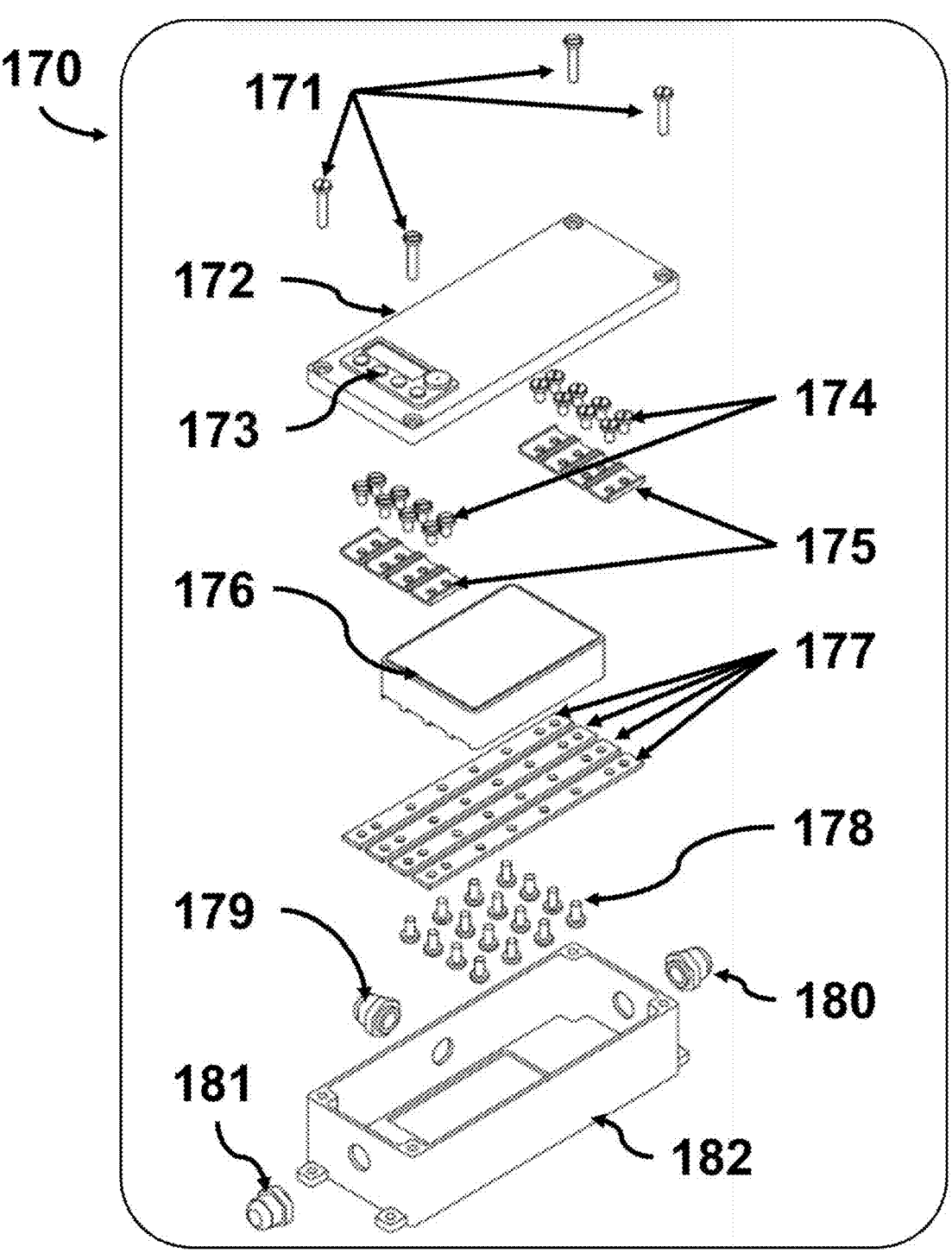
FIG. 19 displays an exploded view of the example embodiment based on the current invention.

Looking to FIG. 19, an exploded view drawing 170 of the example embodiment is displayed. The information in the figure displays drawing 176 of the sealed TSS and all subassemblies including the mounting components and enclosure. Following the numbered subassembly's drawings in top-down direction, FIG. 19 displays the mounting screws 171 used to attach the top cover 172 having an annunciation display 173 to the bottom part 182 of the enclosure. The screws 174 and screw terminal pads 175 are used to securely connect the power line conductors (132 in FIG. 17 and not shown in this figure) to the threaded mounting holes of the busbars 177. In this embodiment, the mounting assemblies' connecting screws 178 use the soldered threaded screw terminals on the bottom side of the PCB of the TSS 176. The bottom part of the TSS enclosure 182 is shown with a side hole for the screw terminal for an auxiliary ground wire connector 179 and two holes for the cable glands 180 and 181.

Figure 20:
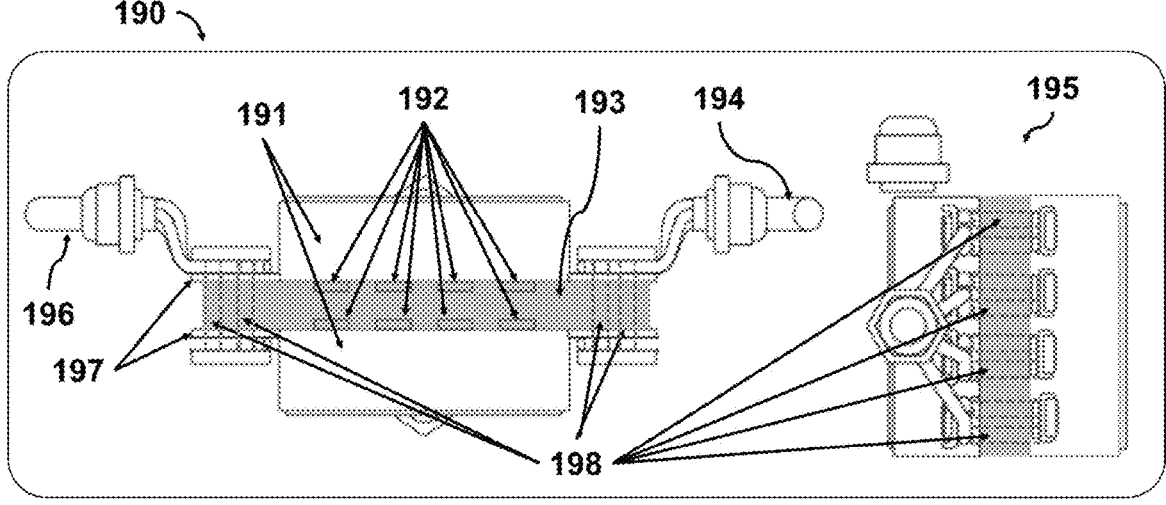
FIG. 20 is an example that illustrates the back-to-back connection of two TSSs to double the surge energy handling capacity.

Looking to FIG. 20, the side and frontal view drawings 190 are presented of two TSSs 191 connected back-to-back in parallel to double the transient surge suppression energy handling capacity for an inline installation of a reconfigurable TSS for EMP protection.

The method and systems based on the described invention provides the ability to connect two TSSs in parallel at a single inline location on an electric power network (EPN) to protect the electrical and electronic devices connected to the EPN. The busbars 197 of the two TSSs 191 are separated by material media 193 and electrically connected using conducting connectors 198. The conductive connectors are displayed on the front side view of the parallel back-to-back configuration and are also displayed on the frontal view 195 of the parallel configuration shown on the right side in FIG. 20. Material media 193 is used for mounting and connection support and for thermal management of the reconfigurable TSSs. The wires of the input cable 198 are connected to the busbars 197 of the two TSSs, respectively, and to the conductors of the cable 194, providing inline installation with high transient surge suppressing capacity. In general, the parallel back-to-back configuration shown in FIG. 20 is a bidirectional surge suppression system.

Figure 21:
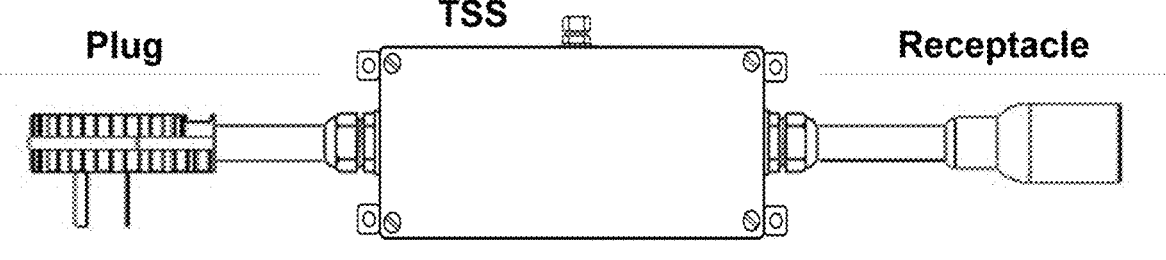
FIG. 21 is an example that illustrates the TSS interconnected with a standard plug and receptacle.

Looking to FIG. 21, an example embodiment is presented using the transient suppressing system interfaced with a standard NEMA 6-30R receptacle and NEMA 6-30P plug rated at 250 VAC and 30 A. The receptacle and connector are for use with electrical equipment requiring up to 30 A and 7.5 kW power. The drawing is only an example. The plug and receptacle can be any commercially available components. The inline assembly of Plug-TSS-Receptacle illustrates the versatile flexibility for reconfigurable interface. Any appropriate pair of plug-receptacle can be used. As shown, the Plug-TSS-Receptacle assembly can be plugged directly into a matching electrical wall outlet and the respective electrical equipment (or appliance) is plugged directly into the matched receptacle. This simple installation offers immediate transient surge protection to the connected electrical load.

Looking to FIG. 22, a table of NEMA standard and commonly used plugs and receptacles for single and three phase AC power lines, 125 V to 250 V DC and AC power lines, and current rating from 15 A to 60 A. The current invention provides the ability for any pair of plug and receptacle to be used to configure inline surge protection system. In addition, any special plug and receptacle with custom voltage and current ratings can be used. For the custom applications the TSS implementation is built with appropriately rated TSSAs.

Looking to FIG. 23, three tables are presented that provide information about currently established standards for electric vehicles charging level categories and typical power output, voltage and current ratings. Table 2 in FIG. 23 lists the AC and DC inlets for North America, Japan, Europe, China, and all market Tesla plug. Table 3 presents Level 1, Level 2, and DC Fast charging connectors with power rating from 1 kW to 350 kW, respectively. Table 4 lists some details for the connector inlets with their maximum current, maximum voltage, and maximum pawer ratings and the governing standards, respectively.

The three tables in FIG. 23 are presented to emphasize the utility of the current invention to provide a reconfigurable interface and be used in these broad ranges of electrical AC and DC power network for transient surge suppression and to provide inline protection with ease of installation and use. In addition, the current invention provides reconfigurable interface that can use any evolving, custom, specialized, and future inlet and plug varieties. An increased current rating is provided using multiple stacked busbars.

Looking to FIG. 24, different meter socket adapters are illustrated with a top view of the enclosure adapters jaws intended for installation between a meter socket and the utility meter. In light of industry trends such as the integration of distributed solar photovoltaic generation and the installation of backup generators in disaster-prone areas, meter socket adapters are being more commonly used within the service entrance of residential, commercial, and industrial buildings. As shown in the FIG. 24, the meter socket adapters are very suitable to utilize of the reconfigurable inline system for EMP protection with the flexibility to conform to the physical dimensions and electrical aspects as governed by ANSI/NEMA standards.

The method in this invention also provides inline installation for applications with cables that have power and communication channels. In such applications the communication channels are routed in parallel to the enclosed TSS from the input to the output cable glands.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specifications and the claims, all terms should be interpreted in the broadest possible manner consistent with the context. In particular, the terms "comprise" and "comprising" should be interpreted as referring to elements, components, or steps in a non-exclusive manner, indicating that the referenced elements, components, or steps may be present, or utilized, or combined with other elements, components, or steps that are not expressly referenced. It is understood that while certain forms of this invention have been illustrated and described, they are not limited thereto except insofar as such limitations are included in the following claims and allowable functional equivalents thereof.

What is claimed is:

1. A method for suppressing an electrical surge induced by a transient electromagnetic energy disturbance from reaching electrical and electronic devices connected to an electrical power network (EPN), said method comprising:

responding to a first overvoltage exceeding a first E1 predetermined threshold level induced by an E1 component of an electromagnetic pulse in said electrical power network (EPN) providing power to connected electrical and electronic devices associated with said EPN, said responding to a first overvoltage comprises limiting, absorbing, and shunting said first overvoltage within less than one nanosecond after said first overvoltage exceeds the first E1 predetermined threshold level so as to limit a level of said first overvoltage to a second E1 predetermined threshold level using a first transient surge suppressing assembly including at least one item selected from the group consisting of: transient voltage suppressors (TVSs), metal oxide varistors (MOVs), gas discharge tubes (GDTs), other solid state and nonlinear components based on semiconductors, compound semiconductors, metamaterials, mechanical, electrical and ionization discharge devices (IDDs);

responding to a second overvoltage exceeding a first E2 predetermined threshold level induced by an E2 component of an electromagnetic pulse in said EPN connected to said electrical and electronic devices associated with said EPN, said responding to a second overvoltage including limiting, absorbing, and shunting said second overvoltage so as to limit a level of said second overvoltage to a second E2 predetermined threshold level using a second transient surge suppressing assembly including at least one item selected from the group consisting of: TVSs, MOVs, GDTs, other solid state and nonlinear components based on semiconductors, compound semiconductors, metamaterials, mechanical, electrical and IDDs;

responding to a third overvoltage exceeding a first E3 predetermined threshold level induced by an E3 component of an electromagnetic pulse in said EPN connected to said electrical and electronic devices associated with said EPN, and said responding to a third overvoltage including limiting, absorbing, and shunting said third overvoltage so as to limit a level of said third overvoltage to a second E3 predetermined threshold level using a third transient surge suppressing assembly including at least one item selected form the group consisting of: TVSs, MOVs, GDTs, other solid state and nonlinear components based on semiconductors, compound semiconductors, metamaterials, mechanical, electrical and IDDs;

wherein said first, second, and third protective assemblies are mounted in a casing, each comprise transient surge suppressing assemblies (TSSAs) mounted on a printed circuit board (PCB) with direct electrical connections to high current capacity busbars and reconfigurable hardware interface connections, compose a surge suppression system (TSS) with reconfigurable interface for inline installation, comprising ability to connect to conductors and utilizing connectors, plugs, receptacles, and outlets specified by existing consumer and industrial electrical standards, emerging electrical connectors developed for new technology applications, and proprietary custom connectors; and wherein said transient suppressing system (TSS) provides ability of two said TSSs with reconfigurable interface to be connected back-to-back in parallel configuration to double the inline energy surge suppressing capacity.

2. The method for suppressing an electrical surge as in claim 1, further comprising electrically connecting said first, second, and third transient surge suppressing assemblies (TSSAs) to provide electrical power network (EMP) surge protection, respectively, intermediate the electrical and electronic devices associated with said EPN constitutes an inline insertion connection such that ability of said EPN to supply high-power alternating current (AC) and direct current (DC) is not altered.

3. The method for suppressing an electrical surge as in claim 1, wherein said inline insertion connection of said first, second, and third transient surge suppressing assemblies, respectively, form protective assemblies that do not cause interference with normal operation of electrical and electronic devices associated with said EPN.

4. The method for suppressing an electrical surge as in claim 1, wherein said inline insertion connection of said first, second, and third protective assemblies, respectively, do not cause mutual operational degradation when limiting, absorbing, and shunting, respectively.

5. The method for suppressing an electrical surge as in claim 1, wherein said casing is mounted inline of said EPN and connected electrical and electronic devices using interoperable hardware connections with matched voltage and current ratings and interface connections based on electrical code and standards.

6. The method for suppressing an electrical surge as in claim 1, wherein said first, second, and third protective assemblies compose said TSS embedded and sealed in said casing with electrically conductive, mutually insulated busbars with input and output connectors for direct inline connection to hot, neutral, and ground conductors of said EPN, respectively, and wherein said casing has accessible inline fuses.

7. A method for suppressing an electrical surge induced by a transient electromagnetic energy disturbance from reaching electrical and electronic devices connected to an electrical power network (EPN), said method comprising:

responding to a first overvoltage exceeding a first E1 predetermined threshold level induced by an E1 component of an electromagnetic pulse in said electrical power network (EPN) providing power to connected electrical and electronic devices associated with said EPN, said responding to a first overvoltage comprises limiting, absorbing, and shunting said first overvoltage within less than one nanosecond after said first overvoltage exceeds the first E1 predetermined threshold level so as to limit a level of said first overvoltage to a second E1 predetermined threshold level using a first transient surge suppressing assembly including at least one item selected from the group consisting of: transient voltage suppressors (TVSs), metal oxide varistors (MOVs), gas discharge tubes (GDTs), other solid state and nonlinear components based on semiconductors, compound semiconductors, metamaterials, mechanical, electrical and ionization discharge devices (IDDs);

responding to a second overvoltage exceeding a first E2 predetermined threshold level induced by an E2 component of an electromagnetic pulse in said EPN connected to said electrical and electronic devices associated with said EPN, said responding to a second overvoltage including limiting, absorbing, and shunting said second overvoltage so as to limit a level of said second overvoltage to a second E2 predetermined threshold level using a second transient surge suppressing assembly including at least one item selected form the group consisting of: TVSs, MOVs, GDTs, other solid state and nonlinear components based on semiconductors, compound semiconductors, metamaterials, mechanical, electrical and IDDs;

responding to a third overvoltage exceeding a first E3 predetermined threshold level induced by an E3 component of an electromagnetic pulse in said EPN connected to said electrical and electronic devices associated with said EPN, and said responding to a third overvoltage including limiting, absorbing, and shunting said third overvoltage so as to limit a level of said third overvoltage to a second E3 predetermined threshold level using a third transient surge suppressing assembly including at least one item selected form the group consisting of: TVSs, MOVs, GDTs, other solid state and nonlinear components based on semiconductors, compound semiconductors, metamaterials, mechanical, electrical and IDDs;

wherein said first, second, and third protective assemblies, mounted in said casing, comprise transient surge suppressing assemblies (TSSAs) mounted on a printed circuit board (PCB) with direct electrical connections to high current capacity busbars and reconfigurable hardware interface connections, compose a surge suppression system (TSS) with reconfigurable interface for inline installation, comprising ability to connect to conductors and utilizing connectors, plugs, receptacles, and outlets specified by existing consumer and industrial electrical standards, emerging electrical connectors developed for new technology applications, and proprietary custom connectors; and wherein said surge suppression system with inline installation using reconfigurable interface includes monitoring of power lines voltage and current conditions, grounding connection condition, and self-monitoring with status indicators using embedded visual, audible, and remote communication signals.

8. A method for suppressing an electrical surge induced by a transient electromagnetic energy disturbance from reaching electrical and electronic devices connected to an electrical power network (EPN), said method comprising:

responding to a first overvoltage exceeding a first E1 predetermined threshold level induced by an E1 component of an electromagnetic pulse in said electrical power network (EPN) providing power to connected electrical and electronic devices associated with said EPN, said responding to a first overvoltage comprises limiting, absorbing, and shunting said first overvoltage within less than one nanosecond after said first overvoltage exceeds the first E1 predetermined threshold level so as to limit a level of said first overvoltage to a second E1 predetermined threshold level using a first transient surge suppressing assembly including at least one item selected from the group consisting of: transient voltage suppressors (TVSs), metal oxide varistors (MOVs), gas discharge tubes (GDTs), other solid state and nonlinear components based on semiconductors, compound semiconductors, metamaterials, and mechanical, electrical and ionization discharge devices (IDDs);

responding to a second overvoltage exceeding a first E2 predetermined threshold level induced by an E2 component of an electromagnetic pulse in said EPN connected to said electrical and electronic devices associated with said EPN, said responding to a second overvoltage including limiting, absorbing, and shunting said second overvoltage so as to limit a level of said second overvoltage to a second E2 predetermined threshold level using a second transient surge suppressing assembly including at least one item selected from the group consisting of: TVSs, MOVs, GDTs, other solid state and nonlinear components based on semiconductors, compound semiconductors, metamaterials, and mechanical, electrical and IDDs;

responding to a third overvoltage exceeding a first E3 predetermined threshold level induced by an E3 component of an electromagnetic pulse in said EPN connected to said electrical and electronic devices associated with said EPN, and said responding to a third overvoltage including limiting, absorbing, and shunting said third overvoltage so as to limit a level of said third overvoltage to a second E3 predetermined threshold level using a third transient surge suppressing assembly including at least one item selected from the group consisting of: TVSs, MOVs, GDTs, other solid state and nonlinear components based on semiconductors, compound semiconductors, metamaterials, and mechanical, electrical and IDDs;

wherein each of said first, second, and third protecting assemblies includes a plurality of limiting, absorbing, and shunting type devices selected from group consisting of: TVSs, MOVs, GDTs, IDDs, solid state and nonlinear components based on semiconductors, compound semiconductors, mechanical, and electronic and electrical components, each of said first, second, and third protecting assemblies being scalable for voltage, current, and energy handling capacity.

9. The method for suppressing an electrical surge as in claim 8, wherein said first, second, and third protecting assemblies have varied response times and said predetermined threshold levels have values E1>E2>E3, respectively, and are operable to react to and suppress one of said E1, E2, and E3 component pulses of said HEMP, respectively.

10. The method for suppressing an electrical surge as in claim 1, wherein said first, second, and third protecting assemblies include components to protect against high voltage transients induced by intentional electromagnetic interference generated by directed energy weapons and electronic warfare systems.

11. A surge suppression system for mitigating and preventing electromagnetic energy surges induced in an electrical power network (EPN) by naturally occurring events from reaching electrical and electronic devices associated with said EPN, said surge suppression system comprising:

a first limiting, absorbing, and shunting assembly that includes at least one item selected from the group consisting of: TVSs, MOVs, GDTs, other solid state and nonlinear components based on semiconductors, compound semiconductors, metamaterials, mechanical, electrical and IDDs; the first assembly being operable to respond to a first overvoltage exceeding a first E1 predetermined threshold level induced by an E1 component pulse in an electrical power network (EPN);

wherein said first limiting, absorbing, and shunting assembly is operable to mitigate said first overvoltage and responds to decrease the first E1 predetermined threshold level of said first overvoltage to a second E1 predetermined threshold level within one nanosecond after said first overvoltage is reached, a second limiting, absorbing, and shunting assembly including at least one item selected from the group consisting of: TVSs, MOVs, GDTs, other solid state and nonlinear components based on semiconductors, compound semiconductors, metamaterials, mechanical, electrical and IDDs; the second assembly being operable to respond to a second overvoltage exceeding a first E2 predetermined threshold level induced by an E2 component pulse in an EPN;

wherein said second limiting, absorbing, and shunting assembly is operable to mitigate said second overvoltage and responds to decrease the level of said second overvoltage to a second E2 predetermined threshold level within less than one microsecond after said second over-voltage exceeds said second E2 predetermined threshold level of said second overvoltage;

a third limiting, absorbing, and shunting assembly including at least one item selected from the group consisting of: TVSs, MOVs, GDTs, other solid state and nonlinear components based on semiconductors, compound semiconductors, metamaterials, mechanical, electrical and IDDs; the third assembly being operable to respond to a third overvoltage exceeding a first E3 predetermined threshold level induced by an E3 component pulse in an EPN;

wherein said third limiting, absorbing, and shunting assembly is operable to mitigate said third overvoltage and responds to decrease the level of said third overvoltage to a second E3 predetermined threshold level within less than one second after said third overvoltage exceeds said second E3 predetermined threshold level of said third overvoltage; and wherein said first, second, and third limiting, absorbing, and shunting assemblies mounted in said casing, comprise transient surge suppressing assemblies (TSSAs) mounted on a printed circuit board (PCB) with direct electrical connections to high current capacity busbars, to minimize insertion losses, and dedicated screw terminals for cable conductors connections at each end of said high current capacity busbars, compose a TSS with reconfigurable interface for inline installation.

12. The surge suppression system as in claim 11, wherein said first limiting, absorbing, and shunting assembly, said second limiting, absorbing, and shunting assembly, and said third limiting, absorbing, and shunting assembly are operable for inline direct hardware connection using reconfigurable interface to connect to hot, neutral, and ground conductors of an AC and positive and negative conductors of a DC EPN at an end point or at midspan of said EPN.

13. The surge suppression system as in claim 11, wherein said first, second, and third limiting, absorbing, and shunting assemblies have varied reaction times and said predetermined threshold levels have values E1>E2>E3, respectively, and are operable to react to said E1, E2, and E3 component pulses generated by naturally occurring CME and GMD, respectively.

14. A surge suppression system for mitigating and preventing electromagnetic energy surges induced in an electrical power network (EPN) by naturally occurring events, such as Coronal mass ejection (CME) and Geomagnetic disturbance (GMD), from reaching electrical and electronic devices associated with said EPN, said surge suppression system comprising:

a first limiting, absorbing, and shunting assembly that includes TVSs, MOVs, GDTs, other solid state and nonlinear components based on semiconductors (i.e., Si, Ge), compound semiconductors (i.e., SiC, GaN, GaAs) and metamaterials, mechanical, electrical and IDDs, and combinations thereof that is operable to respond to a first overvoltage exceeding a first E1 predetermined threshold level induced by an E1 component pulse in an electrical power network (EPN);

wherein said first limiting, absorbing, and shunting assembly is operable to mitigate said first overvoltage and responds to decrease the first E1 predetermined threshold level of said first overvoltage to a second E1 predetermined threshold level within one nanosecond after said first overvoltage is reached, a second limiting, absorbing, and shunting assembly including TVSs, MOVs, GDTs, other solid state and nonlinear components based on semiconductors (i.e., Si, Ge), compound semiconductors (i.e., SiC, GaN, GaAs) and metamaterials, mechanical, electrical and IDDs, and combinations thereof that is operable to respond to a second overvoltage exceeding a first E2 predetermined threshold level induced by an E2 component pulse in an EPN;

wherein said second limiting, absorbing, and shunting assembly is operable to mitigate said second overvoltage and responds to decrease the level of said second overvoltage to a second E2 predetermined threshold level within less than one microsecond after said second over-voltage exceeds said second E2 predetermined threshold level of said second overvoltage;

a third limiting, absorbing, and shunting assembly including TVSs, MOVs, GDTs, other solid state and nonlinear components based on semiconductors (i.e., Si, Ge), compound semiconductors (i.e., SiC, GaN, GaAs) and metamaterials, mechanical, electrical and IDDs, and combinations thereof that is operable to respond to a third overvoltage exceeding a first E3 predetermined threshold level induced by an E3 component pulse in an EPN;

wherein said third limiting, absorbing, and shunting assembly is operable to mitigate said third overvoltage and responds to decrease the level of said third over-voltage to a second E3 predetermined threshold level within less than one second after said third overvoltage exceeds said second E3 predetermined threshold level of said third overvoltage; and wherein said TSS with reconfigurable interface for inline installation is embedded and sealed in said casing with input and output cable glands with access and connections of electric power cable conductors to dedicated screw terminals at each end of said high current capacity busbars and has an additional, externally accessible electrical power ground connector terminal for direct grounding connection.

15. The surge suppression system as in claim 14, wherein said access and connections of cable conductors to dedicated screw terminals at each end of said high current capacity busbars are used for direct inline connection to electric power cable conductors and wherein any additional cable conductors for signaling and communications present in said cable assembly are routed without any intermediate connections and interference.

16. The surge suppression system as in claim 14, wherein said input and output cable glands and said additional, externally accessible electrical power ground connector terminal are mounted on a single or multiple side panels of said casing as to facilitate inline installation of said surge suppression system.

17. The surge suppression system as in claim 14, wherein said access and connections of cable conductors to screw terminals at each end of said high current capacity busbars with mounted and electrically connected said TSS in said casing with said additional, externally accessible electrical power ground connector terminal and said cable glands housing electric power cables for direct inline connection using hardwiring methods are mechanically secured, physically sealed, electrically insulated, and waterproofed for submersible and underground installations.

* * * * *